United States Patent
Cao et al.

(10) Patent No.: US 11,417,769 B2
(45) Date of Patent: Aug. 16, 2022

(54) THIN FILM TRANSISTOR AND METHOD FOR MANUFACTURING SAME, ARRAY SUBSTRATE, DISPLAY PANEL AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Binbin Cao, Beijing (CN); Chao Wang, Beijing (CN); Lin Sun, Beijing (CN)

(73) Assignees: BOE Technology Group Co., LTD., Beijing (CN); Hefei Xinsheng Optoelectronics Technology Co., LTD, Hefei (CN)

( * ) Notice: Subject to any disclaimer, the term of this patent is extended or adjusted under 35 U.S.C. 154(b) by 877 days.

(21) Appl. No.: 16/063,743

(22) PCT Filed: Dec. 12, 2017

(86) PCT No.: PCT/CN2017/115638
§ 371 (c)(1),
(2) Date: Jun. 19, 2018

(87) PCT Pub. No.: WO2018/205596
PCT Pub. Date: Nov. 15, 2018

(65) Prior Publication Data
US 2021/0167220 A1    Jun. 3, 2021

(30) Foreign Application Priority Data

May 11, 2017    (CN) .......................... 201710329780.8

(51) Int. Cl.
*H01L 29/786* (2006.01)
*H01L 21/02* (2006.01)
(Continued)

(52) U.S. Cl.
CPC .. *H01L 29/78633* (2013.01); *H01L 21/02565* (2013.01); *H01L 21/467* (2013.01);
(Continued)

(58) Field of Classification Search
None
See application file for complete search history.

(56) References Cited

U.S. PATENT DOCUMENTS

2010/0038648 A1    2/2010  Cho et al.
2012/0161121 A1*   6/2012  Yamazaki ............. H01L 21/477
                                                        257/43
(Continued)

FOREIGN PATENT DOCUMENTS

CN    104716197 A    6/2015
CN    106057909 A    10/2016
(Continued)

OTHER PUBLICATIONS

First office action of Chinese application No. 201710329780.8 dated May 28, 2019.
(Continued)

*Primary Examiner* — Vincent Wall
(74) *Attorney, Agent, or Firm* — Fay Sharpe LLP

(57) ABSTRACT

Provided are a thin film transistor and method for manufacturing the same, array substrate, display panel and display device. The thin film transistor includes: a gate pattern, a gate insulating layer, an active layer pattern, a source pattern and a drain pattern sequentially stacked. At least one of a surface of the source pattern facing the gate insulating layer, a surface of the drain pattern facing the gate insulating layer, and a surface of the gate pattern facing the gate insulating layer is a target surface which can diffusely reflect lights entering the target surface, to prevent part of the lights from entering the active layer pattern. The display device solves (Continued)

the problem of volt-ampere characteristic curve of the active layer pattern being deflected and a normal operation of the thin film transistor being affected, thereby weakening the influence of lights on the normal operation of the thin film transistor.

16 Claims, 11 Drawing Sheets

(51) Int. Cl.
   *H01L 21/467* (2006.01)
   *H01L 27/12* (2006.01)
   *H01L 29/66* (2006.01)
(52) U.S. Cl.
   CPC ........ *H01L 27/127* (2013.01); *H01L 27/1225* (2013.01); *H01L 27/1288* (2013.01); *H01L 29/66969* (2013.01); *H01L 29/7869* (2013.01)

(56) References Cited

U.S. PATENT DOCUMENTS

| 2013/0043475 A1* | 2/2013 | Kim | ................. | H01L 29/78678 |
| | | | | 257/59 |
| 2018/0308980 A1 | 10/2018 | Qin | | |

FOREIGN PATENT DOCUMENTS

| CN | 106229344 A | 12/2016 |
| CN | 106328714 A | 1/2017 |
| CN | 106653776 A | 5/2017 |
| CN | 107123687 A | 9/2017 |
| JP | 2002303883 A | 10/2002 |

OTHER PUBLICATIONS

International Search Report (including English translation) and Written Opinion of PCT/CN2017/115638, dated Feb. 24, 2018.

* cited by examiner

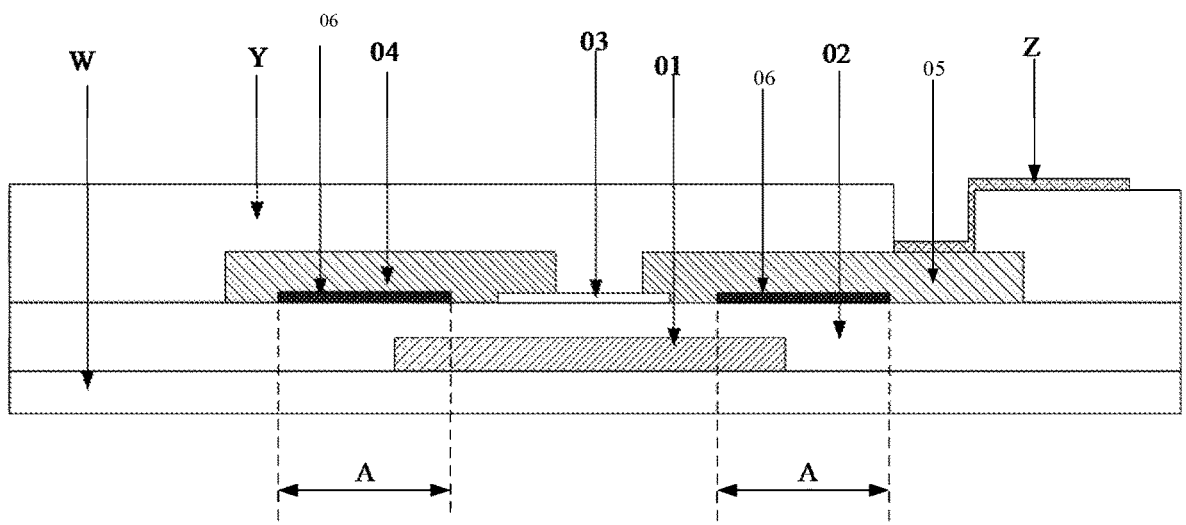

FIG. 6

Manufacturing a thin film transistor including a gate pattern, a gate insulating layer, an active layer pattern, a source pattern, and a drain pattern that are sequentially stacked, where at least one of a surface of the source pattern facing the gate insulating layer, a surface of the drain pattern facing the gate insulating layer, and a surface of the gate pattern facing the gate insulating layer is a target surface, the target surface being capable of diffusely reflecting light entering the target surface to prevent part of the lights from entering the active layer pattern — 701

FIG. 7

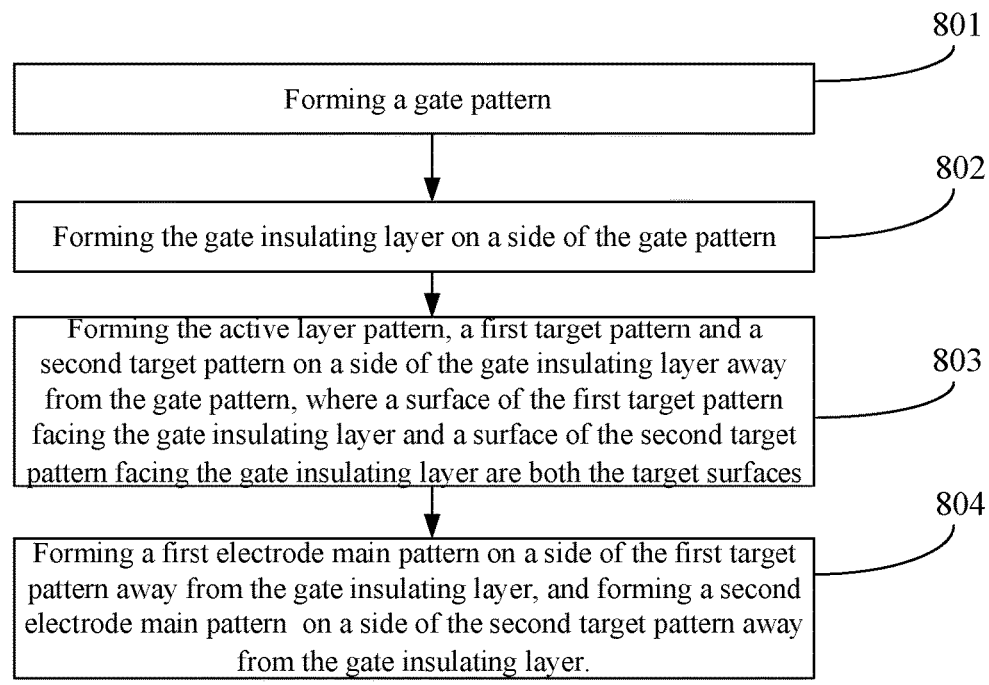

FIG. 8

Manufacturing a thin film transistor including a gate pattern, a gate insulating layer, an active layer pattern, a source-drain pattern and a light absorption pattern, where the gate pattern, the gate insulating layer, the active layer pattern and the source-drain pattern are sequentially stacked; the light absorption pattern is provided on at least a side of the gate insulating layer and is capable of absorbing lights entering the light absorption pattern, so as to prevent the lights from entering the active layer pattern; an orthographic projection region of the light absorption pattern on the gate insulating layer is a target region, an orthographic projection region of the source-drain pattern on the gate insulating layer and an orthographic projection region of the active layer pattern on the gate insulating layer form a reference region, and there is an overlapping region between the target region and the reference region — 1901

FIG. 19

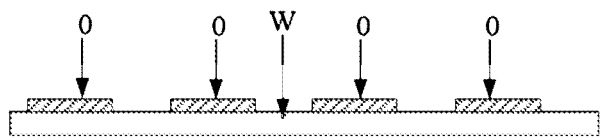

FIG. 20 ively surround two ends of the active layer pattern, and are
THIN FILM TRANSISTOR AND METHOD FOR MANUFACTURING SAME, ARRAY SUBSTRATE, DISPLAY PANEL AND DISPLAY DEVICE This application a 371 of PCT Patent Application Serial No. PCT/CN2017/115698 filed Dec. 12, 2017, which claims priority to Chinese Patent Application No. 201710329780.8, filed with the State Intellectual Property Office on May 11, 2017 and titled "THIN FILM TRANSISTOR AND METHOD FOR MANUFACTURING SAME, ARRAY SUBSTRATE, AND DISPLAY DEVICE", the entire contents of which are incorporated herein by reference.

TECHNICAL FIELD

The present disclosure relates to a thin film transistor and a method for manufacturing the same, an array substrate, a display panel and a display device.

BACKGROUND

An array substrate in a display device includes a base substrate and a plurality of arrayed pixel units provided on one side of the base substrate. Each pixel unit may include a thin film transistor, a pixel electrode, a common electrode, and a liquid crystal.

In the related art, different voltages are usually input to pixel electrodes through thin film transistors, thereby changing a deflection degree of the liquid crystals, adjusting the light transmittances of the pixel units, and further achieving an image displaying function of the display device. Exemplarily, the thin film transistor may include a gate pattern, a gate insulating layer, an active layer pattern, and a source-drain pattern which are sequentially stacked on the base substrate. The source-drain pattern is connected with the active layer pattern. The pixel electrode is connected with a drain electrode in the source-drain pattern. Both of materials for the gate pattern and for the source-drain pattern may be metal, and a material of the active layer pattern may be an oxide semiconductor.

In the related art, the material of the source-drain pattern and the material of the gate pattern are both metal with strong surface light-reflecting capability, and lights incident from the base substrate can be incident on the active layer pattern under the light reflection effects of the source-drain pattern and the gate pattern. When the energy of the lights incident on the active layer pattern reaches a forbidden band width of the active layer pattern, a volt-ampere characteristic curve of the active layer pattern will deflect, which affects a normal operation of the thin film transistor.

SUMMARY

There are provided in the present disclosure a thin film transistor and a method for manufacturing the same, an array substrate, a display panel and a display device.

In a first aspect, there is provided a thin film transistor, including a gate pattern, a gate insulating layer, an active layer pattern, a source pattern and a drain pattern that are sequentially stacked, where at least one of a surface of the source pattern facing the gate insulating layer, a surface of the drain pattern facing the gate insulating layer, and a surface of the gate pattern facing the gate insulating layer is a target surface, and the target surface is capable of diffusely reflecting lights entering the target surface, so as to prevent part of the lights from entering the active layer pattern.

Optionally, the source pattern includes a first target pattern provided on a side of the gate insulating layer away from the gate pattern, and a first electrode main pattern provided on a side of the first target pattern away from the gate pattern;
the drain pattern includes a second target pattern provided on a side of the gate insulating layer away from the gate pattern, and a second electrode main pattern provided on a side of the second target pattern away from the gate pattern;
a surface of the first target pattern facing the gate insulating layer and a surface of the second target pattern facing the gate insulating layer are both the target surface, and the first electrode main pattern and the second electrode main pattern are connected with the active layer pattern respectively.

Optionally, a material of the active layer pattern is an oxide semiconductor, and a material of the first target pattern and a material of the second target pattern are reduced oxide semiconductors;
the first target pattern and the second target pattern respectively surround two ends of the active layer pattern, and are not connected with the active layer pattern.

Optionally, the gate pattern includes a third electrode main pattern, and a third target pattern provided on a side of the third electrode main pattern, the gate insulating layer is provided on a side of the third target pattern away from the third electrode main pattern, and a surface of the third target pattern away from the third electrode main pattern is the target surface.

Optionally, the source pattern includes a first target pattern provided on a side of the gate insulating layer away from the gate pattern, and a first electrode main pattern provided on a side of the first target pattern away from the gate pattern; the drain pattern includes a second target pattern provided on a side of the gate insulating layer away from the gate pattern, and a second electrode main pattern provided on a side of the second target pattern away from the gate pattern; the gate pattern includes a third electrode main pattern and a third target pattern provided on a side of the third electrode main pattern, the gate insulating layer is provided on a side of the third target pattern away from the third electrode main pattern, a surface of the first target pattern towards the gate insulating layer, a surface of the second target pattern towards the gate insulating layer, and a surface of the third target pattern away from the third electrode main pattern are the target surfaces, and both the first electrode main pattern and the second electrode main pattern are connected to the active layer pattern.

Optionally, the active layer pattern includes a first target pattern provided on one side of the gate insulating layer away from the gate pattern, and a first electrode main pattern provided on one side of the first target pattern away from the gate pattern; the drain pattern includes a third electrode main pattern and a third target pattern provided on one side of the third electrode main pattern, where the gate insulating layer is provided on one side of the third target pattern away from the third electrode main pattern; both a surface of the first target pattern towards the gate insulating layer and a surface of the third target pattern away from the third electrode main pattern are the target surfaces, and the first electrode main pattern is connected to the active layer pattern.

Optionally, the drain pattern includes a second target pattern provided on a side of the gate insulating layer away from the gate pattern, and a second electrode main pattern provided on a side of the second target pattern away from the gate pattern; the gate pattern includes a third electrode main pattern and a third target pattern provided on a side of the third electrode main pattern, where the gate insulating layer is provided on a side of the third target pattern away from the third electrode main pattern; both a surface of the second target pattern towards the gate insulating layer and a surface of the third target pattern away from the third electrode main pattern are the target surfaces, and the second electrode main pattern is connected to the active layer pattern.

Optionally, the oxide semiconductor may be indium gallium zinc oxide.

In a second aspect, there is provided another thin film transistor. The thin film transistor includes a gate pattern, a gate insulating layer, an active layer pattern, a source-drain pattern, and a light absorption pattern,
where the gate pattern, the gate insulating layer, the active layer pattern and the source-drain pattern are sequentially stacked, and the light absorption pattern is provided on at least one side of the gate insulating layer and is capable of absorbing lights entering the light absorption pattern to prevent the lights from entering the active layer pattern; and an orthographic projection region of the light absorption pattern on the gate insulating layer is a target region, an orthographic projection region of the source-drain pattern on the gate insulating layer and an orthographic projection region of the active layer pattern on the gate insulating layer form a reference region, and there is an overlapping region between the target region and the reference region.

Optionally, the light absorption pattern is provided on a side of the gate insulating layer close to the gate pattern and covers the gate pattern; or,
the light absorption pattern is provided on a side of the gate insulating layer away from the gate pattern and is located between the gate insulating layer and the active layer pattern, and the target region coincides with the orthographic projection region of the active layer pattern on the gate insulating layer; or,
the light absorption pattern is provided on a side of the gate insulating layer away from the gate pattern, and is located between the gate insulating layer and the source-drain pattern, and the target region does not overlap with the orthographic projection region of the active layer pattern on the gate insulating layer and has an overlapping region with the orthographic projection region of the source-drain pattern on the gate insulating layer.

Optionally, the light absorption pattern includes a first-portion light absorption pattern, a second-portion light absorption pattern, and a third-portion light absorption pattern;
where the first-portion light absorption pattern is provided on a side of the gate insulating layer close to the gate pattern and covers the gate pattern. The second-portion light absorption pattern is provided on a side of the gate insulating layer away from the gate pattern and is located between the gate insulating layer and the active layer pattern, and the target region overlaps with the orthographic projection region of the active layer pattern on the gate insulating layer. The third-portion light absorption pattern is provided on a side of the gate insulating layer away from the gate pattern, and is located between the gate insulating layer and the source-drain pattern, the target region does not overlap with the orthographic projection region of the active layer pattern on the gate insulating layer and has an overlapping region with the orthographic projection region of the source-drain pattern on the gate insulating layer.

In a third aspect, there is provided a method for manufacturing a thin film transistor. The method includes: manufacturing a thin film transistor including a gate pattern, a gate insulating layer, an active layer pattern, a source pattern, and a drain pattern that are sequentially stacked, where at least one of a surface of the source pattern facing the gate insulating layer, a surface of the drain pattern facing the gate insulating layer, and a surface of the gate pattern facing the gate insulating layer is a target surface, the target surface is capable of diffusely reflecting light entering the target surface, so as to prevent part of the lights from entering the active layer pattern.

Optionally, the manufacturing of the thin film transistor including the gate pattern, the gate insulating layer, the active layer pattern, the source pattern and the drain pattern that are sequentially stacked includes:
forming the gate pattern;
forming the gate insulating layer on a side of the gate pattern;
forming the active layer pattern, a first target pattern and a second target pattern on a side of the gate insulating layer away from the gate pattern, where a surface of the first target pattern facing the gate insulating layer and a surface of the second target pattern facing the gate insulating layer are the target surfaces; and
forming a first electrode main pattern on a side of the first target pattern away from the gate pattern, and forming a second electrode main pattern on a side of the second target pattern away from the gate insulating layer, where the first electrode main pattern and the second electrode main pattern are respectively connected with the active layer pattern, the source pattern includes the first target pattern and the first electrode main pattern, and the drain electrode includes the second target pattern and the second electrode main pattern.

Optionally, the forming of the active layer pattern, the first target pattern and the second target pattern on one side of the gate insulating layer away from the gate pattern includes:
forming an oxide semiconductor material layer on a side of the gate insulating layer away from the gate pattern;
forming a photoresist layer on a side of the oxide semiconductor material layer away from the gate pattern;
performing an exposure treatment and a development treatment on the photoresist layer using a grayscale mask plate to obtain a photoresist pattern, where the photoresist pattern includes a first photoresist region, two second photoresist regions and a photoresist fully-removed region, and a photoresist thickness of the first photoresist region is greater than a photoresist thickness of the second photoresist region;
performing an etching treatment on the oxide semiconductor material layer through the photoresist pattern to remove an oxide semiconductor corresponding to the photoresist fully-removed region to obtain a first oxide semiconductor region corresponding to the first photoresist region, and two second oxide semiconductor regions corresponding to the two photoresist regions;
performing a graying treatment on the photoresist pattern to remove photoresist on the two second photoresist regions and thin the photoresist on the first photoresist region;
performing a reduction treatment on the oxide semiconductor of the two second oxide semiconductor regions to obtain the first target pattern and the second target pattern, where a material of the first target pattern and a material of the second target pattern are a reduced oxide semiconductors; and
stripping the photoresist on the first photoresist region to obtain the active layer pattern, where the active layer pattern includes an oxide semiconductor of the first oxide semiconductor region.

Optionally, the first target pattern and the second target pattern respectively surround the active layer pattern, that is, the first target pattern and the second target pattern surround two ends of the active layer pattern, and are not connected with the active layer pattern.

Optionally, the manufacturing of the thin film transistor including the gate pattern, the gate insulating layer, the active layer pattern, the source pattern and the drain pattern that are sequentially stacked includes:

forming a third electrode main pattern;

forming a third target pattern on a side of the third electrode main pattern, where a surface in the third target pattern away from the third electrode main pattern is the target surface, and the gate pattern includes the third electrode main pattern and the third target pattern;

forming the gate insulating layer on a side of the third target pattern away from the third electrode main pattern;

forming the active layer pattern on a side of the gate insulating layer away from the third electrode main pattern; and forming the source pattern and the drain pattern on a side of the active layer pattern away from the gate pattern.

In a fourth aspect, there is provided another method for manufacturing a thin film transistor. The method includes: manufacturing a thin film transistor including a gate pattern, a gate insulating layer, an active layer pattern, a source-drain pattern, and a light absorption pattern, where the gate pattern, the gate insulating layer, the active layer pattern and the source-drain pattern are sequentially stacked, and the light absorption pattern is provided on at least one side of the gate insulating layer and is capable of absorbing lights entering the light absorption pattern, so as to prevent the lights from entering the active layer pattern; an orthographic projection region of the light absorption pattern on the gate insulating layer is a target region, an orthographic projection region of the source-drain pattern on the gate insulating layer and an orthographic projection region of the active layer pattern on the gate insulating layer form a reference region, and there is an overlapping region between the target region and the reference region.

Optionally, the light absorption pattern is provided on a side of the gate insulating layer close to the gate pattern and covers the gate pattern; or, the light absorption pattern is provided on a side of the gate insulating layer away from the gate pattern and is located between the gate insulating layer and the active layer pattern, where the target region coincides with the orthographic projection region of the active layer pattern on the gate insulating layer; or, the light absorption pattern is provided on a side of the gate insulating layer away from the gate pattern, and is located between the gate insulating layer and the source-drain pattern, where the target region does not overlap with the orthographic projection region of the active layer pattern on the gate insulating layer and has an overlapping region with the orthographic projection region of the source-drain pattern on the gate insulating layer.

In a fifth aspect, there is provided an array substrate, including the thin film transistor described in the first aspect or the second aspect.

In a sixth aspect, there is provided a display device, including the array substrate described in the fifth aspect.

In a seventh aspect, there is provided a display panel, including the array substrate described in the fifth aspect.

BRIEF DESCRIPTION OF THE DRAWINGS

FIG. 3-1 is a schematic diagram of a structure of another thin film transistor provided in an embodiment of the present disclosure;

FIG. 3-2 is a schematic diagram of a structure of yet another thin film transistor provided in an embodiment of the present disclosure;

FIG. 3-3 is a schematic diagram of a structure of still yet another thin film transistor provided in an embodiment of the present disclosure;

FIG. 3-4 is a schematic diagram of a structure of a thin film transistor provided in another embodiment of the present disclosure;

FIG. 3-5 is a schematic diagram of a structure of another thin film transistor provided in another embodiment of the present disclosure;

FIG. 3-6 is a schematic diagram of a structure of yet another thin film transistor provided in another embodiment of the present disclosure;

FIG. 4 is a schematic diagram of a structure of still yet another thin film transistor provided in another embodiment of the present disclosure;

FIG. 5 is a schematic diagram of a structure of a thin film transistor provided in yet another embodiment of the present disclosure;

FIG. 6 is a schematic diagram of a structure of another thin film transistor provided in yet another embodiment of the present disclosure;

FIG. 7 is a flowchart of a method for manufacturing a thin film transistor provided in an embodiment of the present disclosure;

FIG. 8 is a flowchart of another method for manufacturing a thin film transistor provided in an embodiment of the present disclosure;

FIG. 19 is a flowchart of a method for manufacturing another thin film transistor provided in an embodiment of the present disclosure; and FIG. 20 is a schematic diagram of a structure of an array substrate provided in an embodiment of the present disclosure.

DETAILED DESCRIPTION

The present disclosure will be described in further detail with reference to the accompanying drawings, to clearly present the principles and advantages of the present disclosure.

Figure 1:
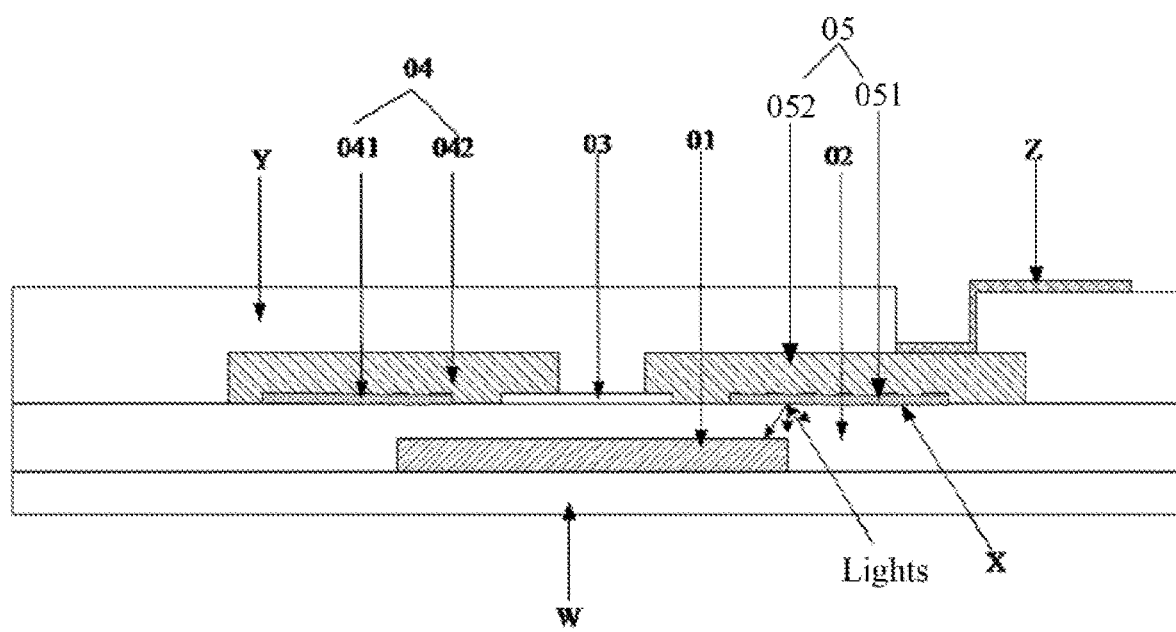
FIG. 1 is a schematic diagram of a structure of a thin film transistor provided in an embodiment of the present disclosure.

FIG. 1 is a schematic diagram of a structure of a thin film transistor provided in an embodiment of the present disclosure. As shown in FIG. 1, the thin film transistor may include: a gate pattern 01, a gate insulating layer 02, an active layer pattern 03, a source pattern 04 and a drain pattern 05 that are sequentially stacked.

At least one of a surface of the source pattern 04 facing the gate insulating layer 02, a surface of the drain pattern 05 facing the gate insulating layer 02, and a surface of the gate pattern 01 facing the gate insulating layer 02 is a target surface X. The target surface X is capable of diffusely reflecting light entering the target surface to prevent part of the lights from entering the active layer pattern 03. FIG. 1 is illustrated by taking an example in which the surface of the drain pattern 05 facing the gate insulating layer 02 is the target surface X.

From the above, in the thin film transistor provided by embodiments of the present disclosure, since the surface of the source pattern facing the gate insulating layer, the surface of the drain pattern facing the gate insulating layer and the surface of the gate pattern facing the gate insulating layer include the target surface, and the target surface is capable of diffusely reflecting lights entering the target surface to prevent part of the lights from entering the active layer pattern, therefore, the amount of lights entering the active layer pattern is reduced, the deflection degree of a volt-ampere characteristic curve of the active layer pattern is decreased, and the influence of the light on the normal operation of the thin film transistor is weakened.

Since the target surface may be at least one of the surface of the source pattern 04 facing the gate insulating layer 02, the surface of the drain pattern 05 facing the gate insulating layer 02 and the surface of the gate pattern 01 facing the gate insulating layer 02, the target surface may have various forms which are described below.

In the first form of the target surface, referring to FIG. 1 again, the source pattern 04 may include a first target pattern 041 provided on a side of the gate insulating layer 02 away from the gate insulating layer 02, and a first electrode main pattern 042 provided on a side of the first target pattern 041 away from the gate insulating layer 02. The drain pattern 05 may include a second target pattern 051 provided on a side of the gate insulating layer 02 away from the gate insulating layer 02, and a second electrode main pattern 052 provided on a side of the second target pattern 051 away from the gate insulating layer 02. The surface of the first target pattern 041 facing the gate insulating layer 02 and the surface of the second target pattern 052 facing the gate insulating layer 02 may be the target surface X. The first electrode main pattern 042 and the second electrode main pattern 052 may be connected with the active layer pattern 03, and a pixel electrode may be connected with the second electrode main pattern 052, so as to realize a connection with the thin film transistor. That is, when the lights enters the first target pattern 041 and the second target pattern 051, the lights can be diffusely reflected on the target surfaces X of the first target pattern 041 and the second target pattern 051, such that part of the lights cannot enter the gate pattern 01, and then cannot be reflected by the gate pattern 01 to the active layer pattern 03, thereby preventing the part of the lights from entering the active layer pattern 03.

Optionally, the thin film transistor provided by the embodiments of the present disclosure (the thin film transistors as shown in FIG. 1) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

Optionally, a material of the active layer pattern 03 may be an oxide semiconductor. A material of the first target pattern 041 and a material of the second target pattern 051 may be a reduced oxide semiconductor respectively. Since the surface of the reduced oxide semiconductor is relatively rough, both the first target pattern 041 and the second target pattern 051 can diffusely reflect light. Exemplarily, the oxide semiconductor may be indium gallium zinc oxide (IGZO). As an active layer material and comparing with the conventional amorphous silicon material, the oxide semiconductor has the advantages of high carrier mobility, low preparation temperature, excellent large-area uniformity, high optical transmittance and etc., which makes the oxide thin film transistor suitable for producing a high-resolution display device.

It should be noted that in the related art, an amorphous indium gallium zinc oxide is generally used to produce an active layer pattern. The amorphous indium gallium zinc oxide is a typical transparent metal oxide semiconductor and has a good light transmittance in a visible light band. When lights having a wavelength of 420 nm or more are irradiated to the active layer pattern of the amorphous indium gallium zinc oxide material, a volt-ampere characteristic curve of the thin film transistor is relatively stable. However, when ultraviolet lights having a wavelength of 450 nm or less are irradiated, a volt-ampere characteristic curve of the thin film transistor drifts sharply and is unstable due to that the energy of the ultraviolet light has already been higher than a forbidden band width (3.2 electron volts to 3.6 electron volts) of the active layer pattern of the amorphous indium gallium zinc oxide material. However, in the thin film transistor provided by the embodiments of the present disclosure, the target surface is capable of diffusely reflecting lights entering the target surface to prevent part of the lights from entering the active layer pattern, such that the amount of light entering the active layer pattern is reduced, and the deflection degree of a volt-ampere characteristic curve of the active layer pattern is decreased.

Figure 2:
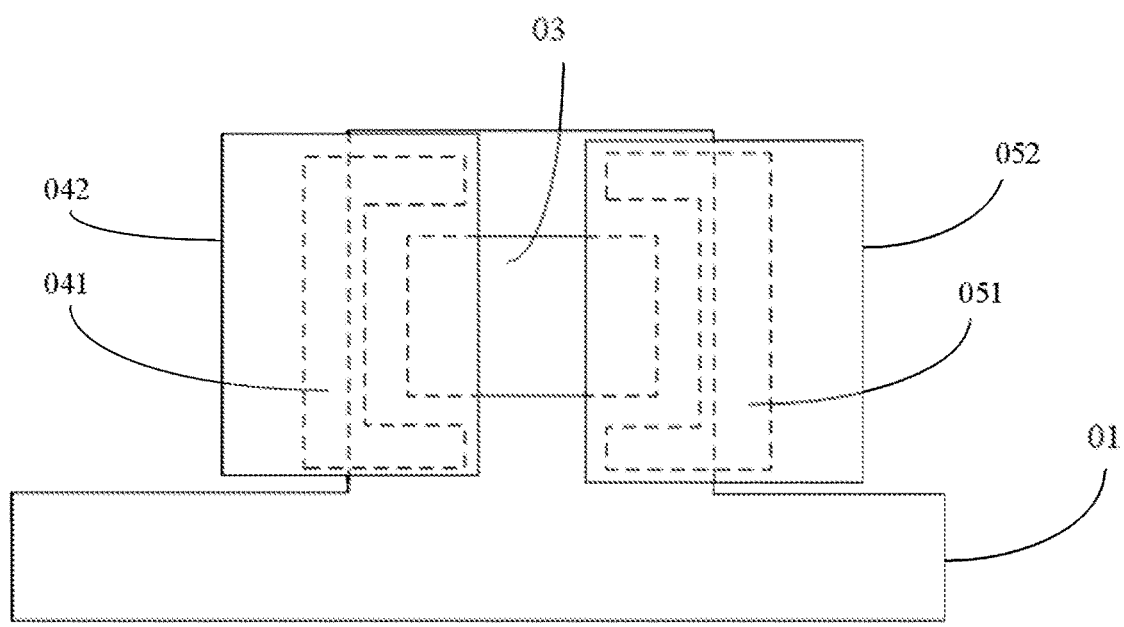
FIG. 2 is a schematic diagram of positions of a first target pattern, a second target pattern and an active layer pattern provided in an embodiment of the present disclosure.

FIG. 2 is a schematic diagram of positions of a first target pattern, a second target pattern and an active layer pattern provided in an embodiment of the present disclosure. In order to prevent more lights from entering the active layer pattern 03 as much as possible, both the first target pattern 041 and the second target pattern 051 may be provided around the active layer pattern 03. As shown in FIG. 2, the first target pattern 041 and the second target pattern 051 surround two ends of the active layer pattern 03, respectively. In addition, in order to ensure that the characteristics of the active layer pattern 03 are not affected by the first target pattern 041 and the second target pattern 051, both the first target pattern 041 and the second target pattern 051 may be set not to be connected with the active layer pattern 03.

Figures 1, 3:
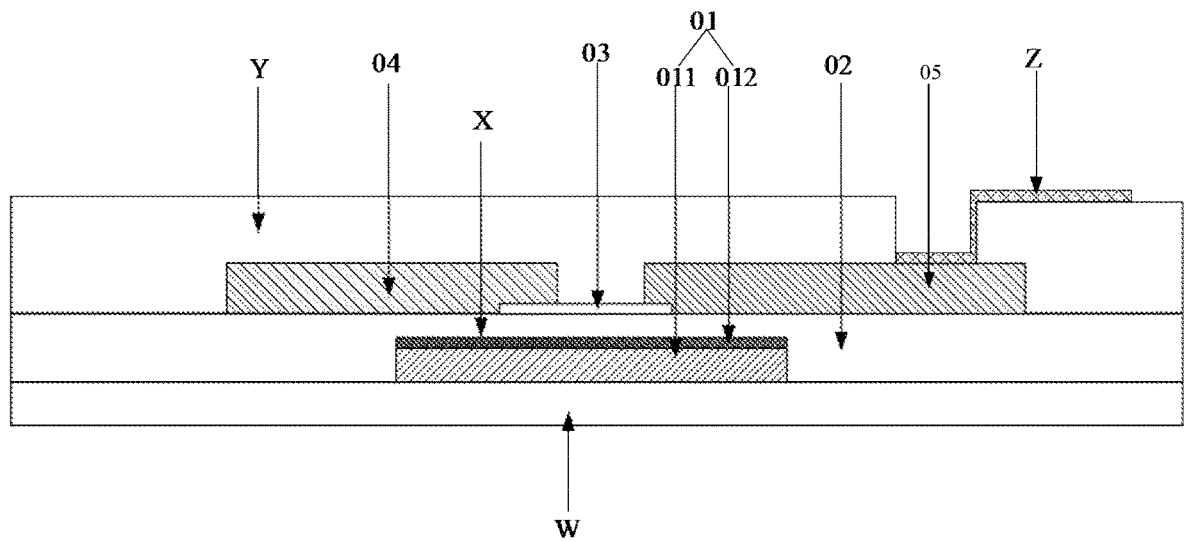
Figures 2, 3:
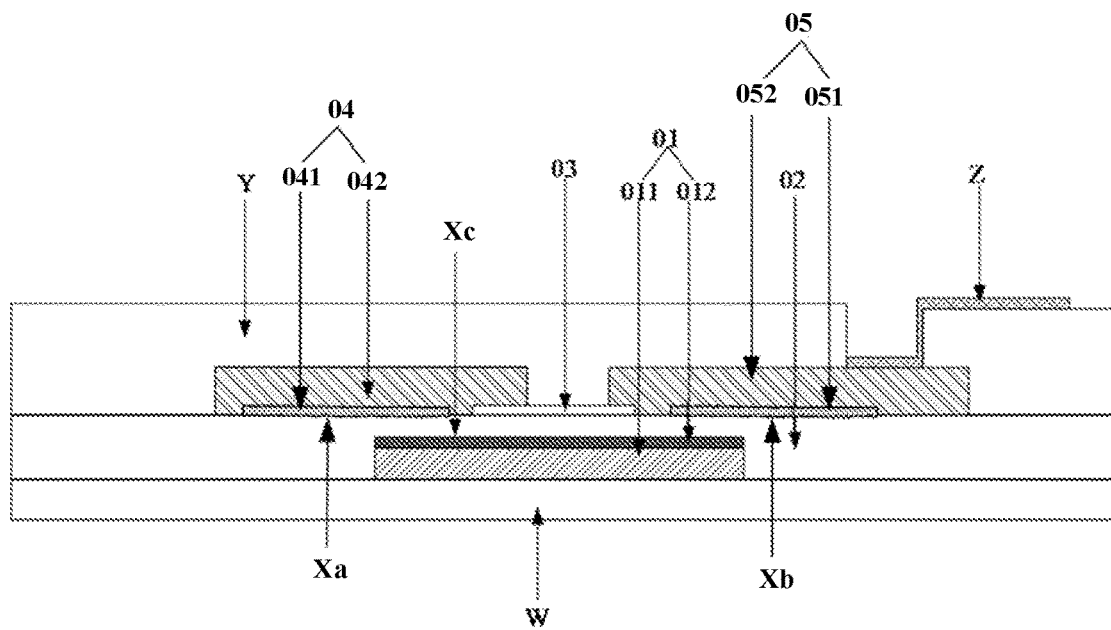
Figure 3:
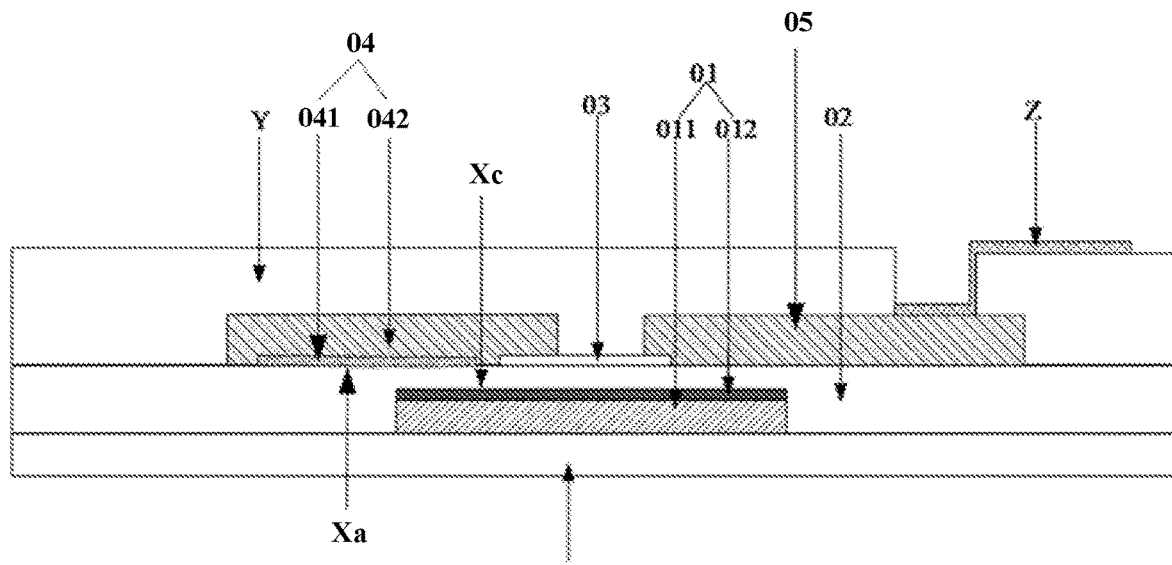

In the second form of the target surface, FIG. 3-1 is a schematic diagram of a structure of another thin film transistor provided by an embodiment of the present disclosure. As shown in FIG. 3-1, the gate pattern 01 may include a third electrode main pattern 011, and a third target pattern 012 provided on a side of the third electrode main pattern 011. The gate insulating layer 02 is provided on a side of the third target pattern 012 away from the third electrode main pattern 011, and the surface of the third target pattern 012 away from the third electrode main pattern 011 is the target surface X. That is, when lights enter the third target pattern 012, the lights can be diffusely reflected on the target surface X of the third target pattern 012, such that part of the lights cannot enter the active layer pattern 03, thereby preventing the part of the lights from entering the active layer pattern 03. Optionally, a material of the third target pattern 012 may be a conductive material or an insulating material, and the surface of the third target pattern 012 away from the gate pattern 01 is uneven. That is, the surface of the third target pattern 012 away from the gate pattern 01 is the target surface X. Optionally, the material of the third target pattern 012 may be the same as the material of the gate insulating layer 02.

Optionally, the thin film transistor provided by the embodiments of the present disclosure (the thin film transistors as shown in FIG. 3-1) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

In the third form of the target surface, FIG. 3-2 is a schematic diagram of a structure of yet another thin film transistor provided in an embodiment of the present disclosure. As shown in FIG. 3-2, the source pattern 04 includes a first target pattern 041 and a first electrode main pattern 042. The drain pattern 05 includes a second target pattern 051 and a second electrode main pattern 052. The gate pattern 01 includes a third electrode main pattern 011 and a third target pattern 012. The surface of the first target pattern 041 facing the gate insulating layer 02, the surface of the second target pattern 051 facing the gate insulation layer 02, and the surface of the third target pattern 012 away from the third electrode main pattern 011 are all the target surface, denoted by Xa, Xb, Xc respectively.

Optionally, the thin film transistor provided by the embodiments of the present disclosure (the thin film transistors as shown in FIG. 3-2) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

In the fourth form of the target surface, FIG. 3-3 is a schematic diagram of a structure of still another thin film transistor provided in an embodiment of the present disclosure. As shown in FIG. 3-3, the source pattern 04 includes a first target pattern 041 and a first electrode main pattern 042. The gate pattern 01 includes a third electrode main pattern 011 and a third target pattern 012. The surface of the first target pattern 041 facing the gate insulating layer 02 and the surface of the third target pattern 012 away from the third electrode main pattern 011 are both the target surface, denoted by Xa and Xc respectively.

Optionally, the thin film transistor provided by the embodiments of the present disclosure (the thin film transistors as shown in FIG. 3-3) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

Figures 3, 4:
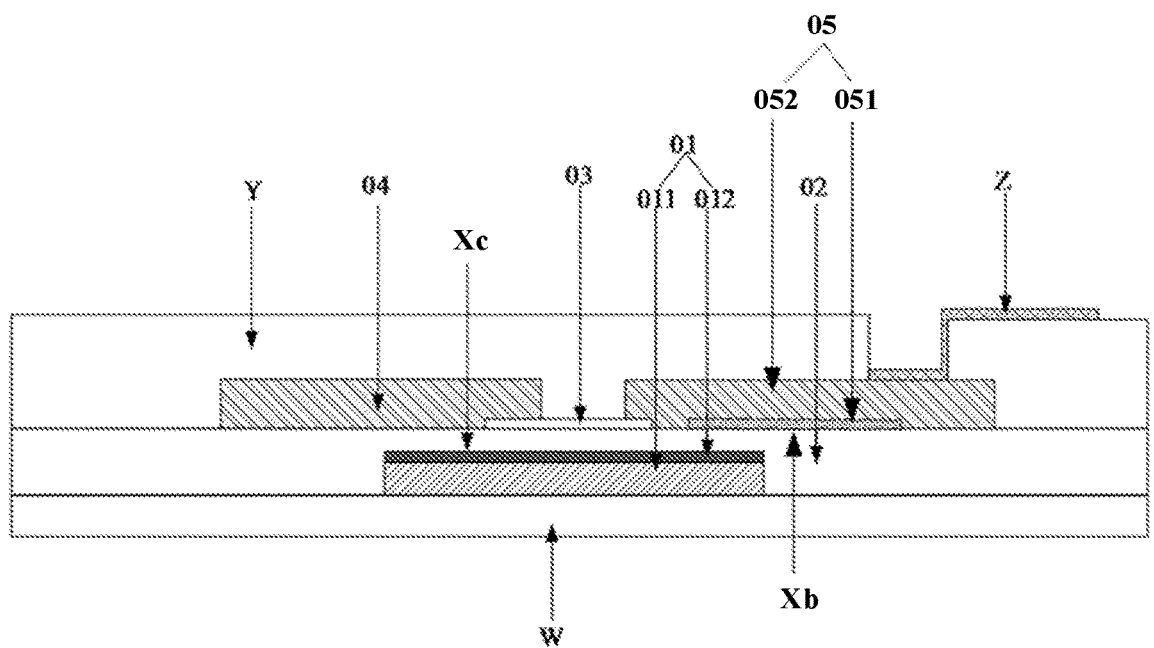

In the fifth form of the target surface, FIG. 3-4 is a schematic diagram of a structure of a thin film transistor provided in another embodiment of the present disclosure. As shown in FIGS. 3-4, the drain pattern 05 includes a second target pattern 051 and a second electrode main pattern 052. The gate pattern 01 includes a third electrode main pattern 011 and a third target pattern 012. The surface of the second target pattern 051 facing the gate insulation layer 02 and the surface of the third target pattern 012 away from the third electrode body pattern 011 are both the target surface, denoted by Xb and Xc respectively.

Optionally, the thin film transistor provided by the embodiments of the present disclosure (the thin film transistors as shown in FIG. 3-4) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

Figures 3, 4, 5:
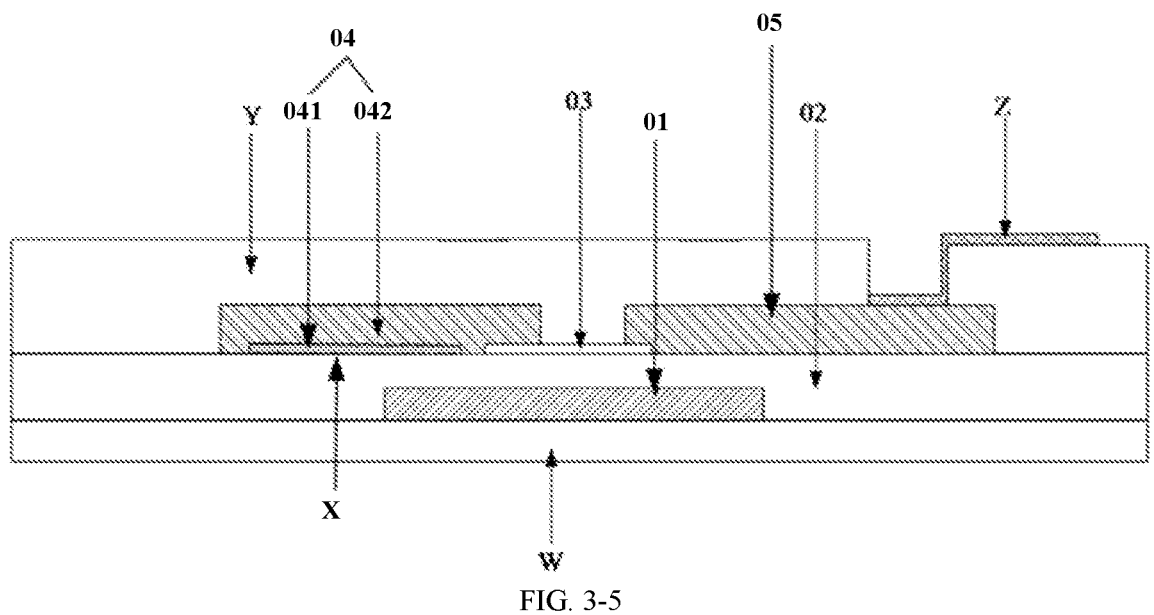

In the sixth form of the target surface, FIG. 3-5 is a schematic diagram of a structure of another thin film transistor provided in another embodiment of the present disclosure. As shown in FIG. 3-5, the source pattern 04 includes a first target pattern 041 and a first electrode main pattern 042. The surface of the first target pattern 041 facing the gate insulating layer 02 is the target surface X.

Optionally, the thin film transistor provided by the embodiments of the present disclosure (the thin film transistors as shown in FIG. 3-5) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

In the seventh form of the target surface, FIG. 3-6 is a schematic diagram of a structure of yet another thin film transistor provided in another embodiment of the present disclosure. As shown in FIG. 3-6, the drain pattern 05 includes a second target pattern 051 and a second electrode main pattern 052. The surface of the second target pattern 051 facing the gate insulating layer 02 is the target surface X.

Optionally, the thin film transistor provided by the embodiments of the present disclosure (the thin film transistors as shown in FIG. 3-6) may further include a passivation layer Y, and a pixel electrode Z may be connected with a drain pattern 05 through a via hole in the passivation layer Y. In the embodiments of the present disclosure, as an example, the thin film transistor is provided on a base substrate W, which is not limited in the embodiment of the present disclosure.

From the above, in the thin film transistor provided by the embodiment of the present disclosure, since the surface of the source pattern facing the gate insulating layer, the surface of the drain pattern facing the gate insulating layer and the surface of the gate pattern facing the gate insulating layer include the target surface, and the target surface is capable of diffusely reflecting lights entering the target surface to prevent part of the lights from entering the active layer pattern, therefore, the amount of lights entering the active layer pattern is reduced, the deflection degree of a volt-ampere characteristic curve of the active layer pattern is decreased, and the influence of the light on the normal operation of the thin film transistor is weakened.

FIG. 4 is a schematic diagram of a structure of still another thin film transistor provided in another embodiment of the present disclosure. As shown in FIG. 4, the thin film transistor may include a gate pattern 01, a gate insulating layer 02, an active layer pattern 03, a source-drain pattern (including the source pattern 04 and the drain pattern 05), and a light absorption pattern 06.

In FIG. 4, the gate pattern 01, the gate insulating layer 02, the active layer pattern 03, and the source-drain pattern are sequentially stacked. The light absorption pattern 06 is provided on at least one side of the gate insulating layer 02. The light absorption pattern 06 can absorb lights entering the light absorption pattern 06, so as to prevent lights (i.e., the lights absorbed by the light absorption pattern, such as all or part of lights entering the thin film transistor) from entering the active layer pattern.

An orthogonal projection region of the light absorption pattern 06 on the gate insulating layer 02 is a target region A. An orthographic projection region of the source-drain pattern on the gate insulating layer 02 and an orthographic projection region of the active layer pattern 03 on the gate insulating layer 02 form a reference region B, and there is an overlapping region between the target region A and the reference region B.

From the above, since the thin film transistor provided by the embodiments of the present disclosure includes the light absorption pattern, and the orthogonal projection region of the light absorption pattern on the gate insulating layer is the target region, the orthographic projection region of the source-drain pattern on the gate insulating layer and the orthographic projection region of the active layer pattern on the gate insulating layer form the reference region, and there is the overlapping region between the target region and the reference region, therefore, lights entering a space between the active layer and the gate pattern can be absorbed by the light absorption patter, the amount of lights entering the active layer pattern is reduced, the deflection degree of a volt-ampere characteristic curve of the active layer pattern is decreased, and the influence of the light on the normal operation of the thin film transistor is weakened.

Optionally, as an example, in FIG. 4 the light absorption pattern 06 is provided on a side of the gate insulating layer 02 close to the gate pattern 01, and the light absorption pattern 06 covers the gate pattern 01.

FIG. 5 is a schematic diagram of a structure of a thin film transistor provided in another embodiment of the present disclosure. As shown in FIG. 5, the light absorption pattern 06 may also be provided on a side of the gate insulating layer 02 away from the gate pattern 01 and may be located between the gate insulating layer 02 and the active layer pattern 03. The target region A coincides with the orthographic projection region of the active layer pattern 03 on the gate insulating layer 02.

Figures 3, 4, 5, 6:
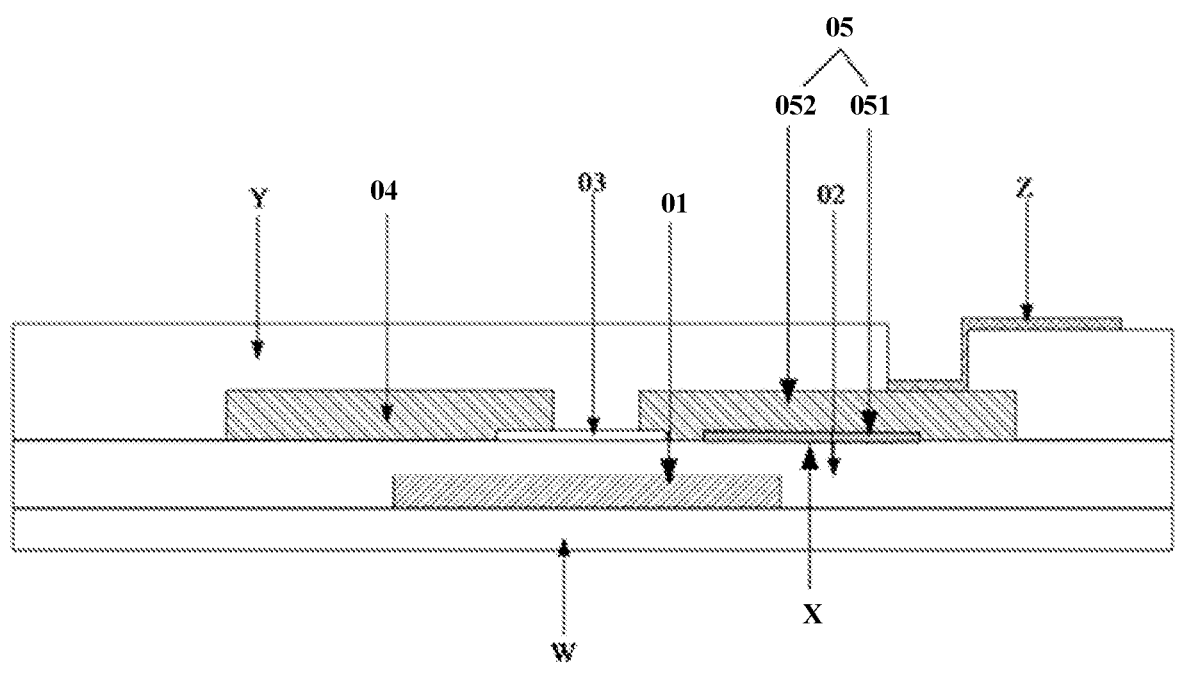
Figure 4:
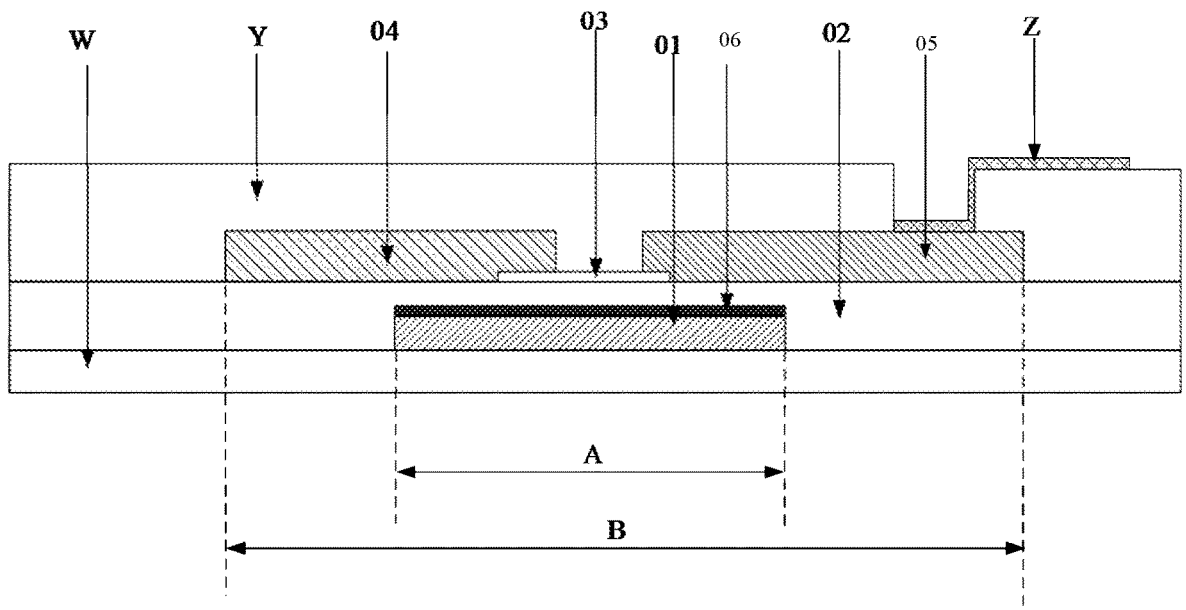
Figure 5:
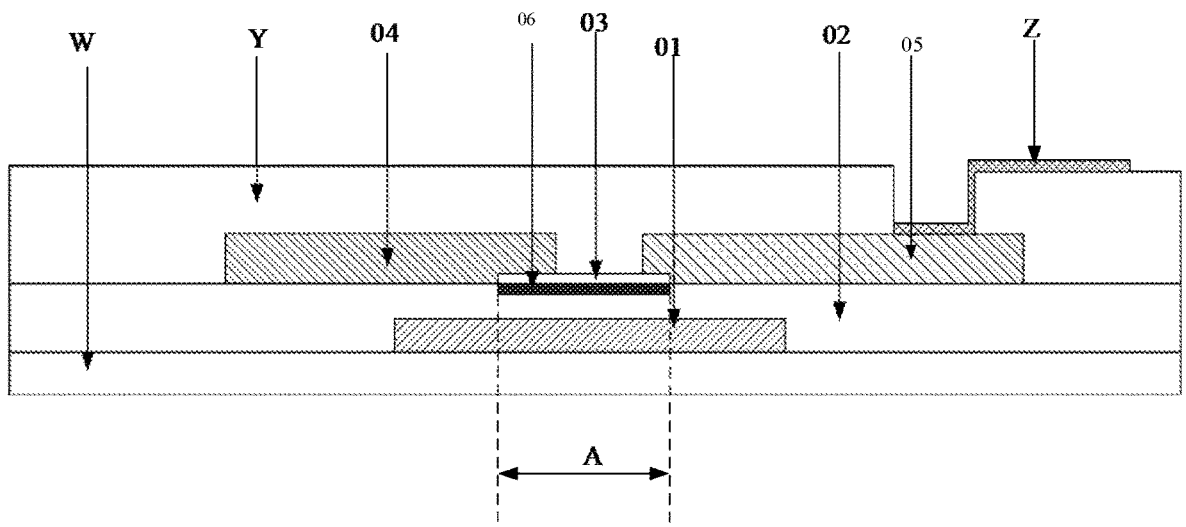

Alternatively, FIG. 6 is a schematic diagram of a structure of another thin film transistor provided in another embodiment of the present disclosure. As shown in FIG. 6, the light absorption pattern 06 may be provided on a side of the gate insulating layer 02 away from the gate pattern 01, and may be located between the gate insulating layer 02 and the source-drain pattern. The target region A does not overlap with the orthographic projection region of the active layer pattern 03 on the gate insulating layer 02 and has an overlapping region with the orthographic projection region of the source-drain pattern on the gate insulating layer 02.

Exemplarily, a material of the light absorption pattern 06 in each of FIGS. 4 and 6 may be a black conductive material or a black insulating material. For example, the material of the light absorption pattern 06 in each of FIGS. 4 and 6 may be carbon. A material of the light absorption pattern 06 in FIG. 5 may be a black insulating material. For example, the material of the light absorption pattern 06 in FIG. 5 may be the same as a material of a black matrix (BM).

Optionally, the thin film transistor shown in FIG. 6 includes two light absorption patterns 06 which are provided under the source pattern and the drain pattern respectively. In some embodiments, the thin film transistor shown in FIG. 6 may further include only one light absorption pattern 06 which may be provided under the source pattern or under the drain pattern.

Further, the light absorption patterns in the thin film transistor may also be distributed at the same time in positions shown in at least two of FIG. 4, FIG. 5, and FIG. 6. When the light absorption patterns are distributed at the same time in positions shown in FIG. 4, FIG. 5 and FIG. 6, the light absorption patterns are provided under the source pattern and the drain pattern, above the gate electrode, and below the active layer in the thin film transistor. In this case, the light absorption patterns include a first-portion light absorption pattern, a second-portion light absorption pattern, and a third-portion light absorption pattern. The first-portion light absorption pattern is provided on a side of the gate insulating layer close to the gate pattern and covers the gate pattern. The second-portion light absorption pattern is provided on a side of the gate insulating layer away from the gate pattern and located between the gate insulating layer and the active layer pattern, where the target region coincides with the orthographic projection region of the active layer pattern on the gate insulating layer. The third-portion light absorption pattern is provided on a side of the gate insulating layer away from the gate pattern and located between the gate insulating layer and the source-drain pattern, where the target region does not overlap with the orthographic projection region of the active layer pattern on the gate insulating layer and has an overlapping region with the orthographic projection region of the source-drain pattern on the gate insulating layer.

Optionally, the thin film transistors shown in FIG. 4, FIG. 5 and FIG. 6 may each further include a passivation layer Y. The pixel electrode Z may be connected with the source-drain pattern through a via hole in the passivation layer Y. In FIG. 4, FIG. 5 and FIG. 6, as an example, the thin film transistor is provided on a base substrate W, which is not limited in the embodiment of the present disclosure.

From the above, since the thin film transistor provided by the embodiments of the present disclosure includes the light absorption pattern, and the orthogonal projection region of the light absorption pattern on the gate insulating layer is the target region, the orthographic projection region of the source-drain pattern on the gate insulating layer and the orthographic projection region of the active layer pattern on the gate insulating layer form the reference region, and there is the overlapping region between the target region and the reference region, therefore, lights entering a space between the active layer and the gate pattern can be absorbed by the light absorption patter, the amount of lights entering the active layer pattern is reduced, the deflection degree of a volt-ampere characteristic curve of the active layer pattern is decreased, and the influence of the light on the normal operation of the thin film transistor is weakened.

FIG. 7 is a flowchart of a method for manufacturing a thin film transistor provided in an embodiment of the present disclosure. The thin film transistor may be the one shown in FIG. 1, FIG. 3-1, FIG. 3-2, FIG. 3-3, FIG. 3-4, FIG. 3-5 or FIG. 3-6. As shown in FIG. 7, the method may include the following operation:

manufacturing a thin film transistor including a gate pattern, a gate insulating layer, an active layer pattern, a source pattern, and a drain pattern that are sequentially stacked in step 701, where at least one of a surface of the source pattern facing the gate insulating layer, a surface of the drain pattern facing the gate insulating layer, and a surface of the gate pattern facing the gate insulating layer is a target surface, the target surface being capable of diffusely reflecting light entering the target surface to prevent part of the lights from entering the active layer pattern.

From the above, in the thin film transistor manufactured by using the method provided in the embodiment of the present disclosure, since the surface of the source pattern facing the gate insulating layer, the surface of the drain pattern facing the gate insulating layer and the surface of the gate pattern facing the gate insulating layer include the target surface, and the target surface is capable of diffusely reflecting lights entering the target surface to prevent part of the lights from entering the active layer pattern, therefore, the amount of lights entering the active layer pattern is reduced, the deflection degree of a volt-ampere characteristic curve of the active layer pattern is decreased, and the influence of the light on the normal operation of the thin film transistor is weakened.

FIG. 8 is a flowchart of another method for manufacturing a thin film transistor provided in an embodiment of the present disclosure. The thin film transistor may be the one shown in FIG. 1. As shown in FIG. 8, the method may include the following steps.

In step 801, agate pattern is formed.

Figure 9:
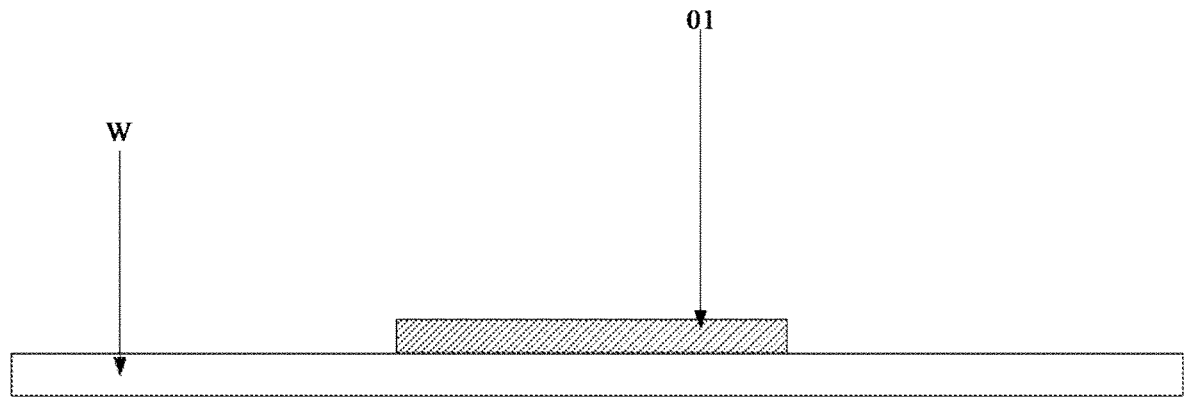
FIG. 9 is a schematic diagram of a local structure of a first thin film transistor provided in an embodiment of the present disclosure.

FIG. 9 is a schematic diagram of a local structure of a first thin film transistor provided in an embodiment of the present disclosure. As shown in FIG. 9, in step 801, a layer of metal material may be deposited on the base substrate W by coating, magnetron sputtering, thermal evaporation or plasma enhanced chemical vapor deposition (PECVD) first to obtain a metal material layer. Then, the metal material layer is treated by a primary patterning process to obtain the gate pattern 01. Herein, the primary patterning process includes photoresist coating, exposure, development, etching, and photoresist stripping. Therefore, the treatment of the metal material layer by the primary patterning process includes: coating the metal material layer with a layer of photoresist; exposing the photoresist using a mask plate, such that the photoresist forms a full-exposed region and a non-exposed region; performing a development process for treatment, such that the photoresist in the full-exposed region is removed and the photoresist in the non-exposed region remains; etching a region corresponding to the full-exposed region on the metal material layer; and stripping the photoresist in the non-exposed region after etching to obtain the gate pattern 01.

In step 802, the gate insulating layer is formed on a side of the gate pattern.

Figure 10:
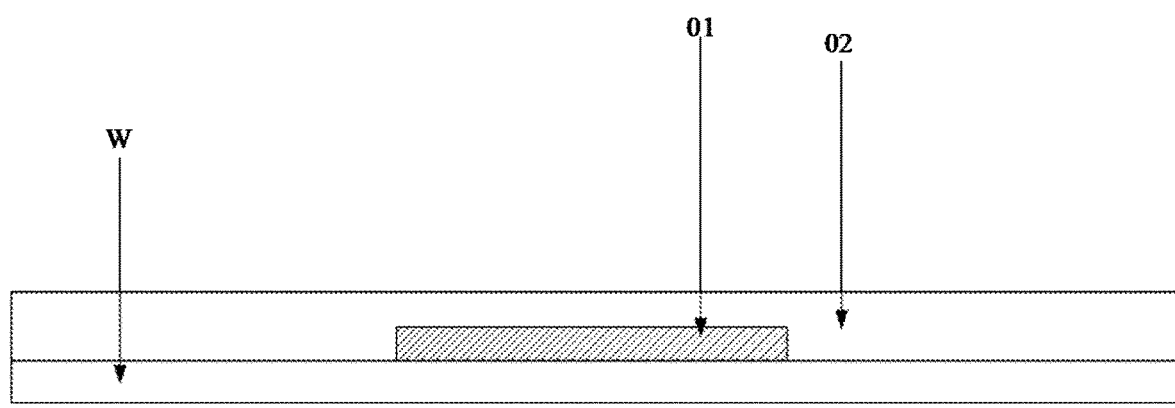
FIG. 10 is a schematic diagram of a local structure of a second thin film transistor provided in an embodiment of the present disclosure.

FIG. 10 is a schematic diagram of a local structure of a second thin film transistor provided in an embodiment of the present disclosure. As shown in FIG. 10, a gate insulating layer 02 may be coated on the gate pattern 01.

In step 803, the active layer pattern, a first target pattern and a second target pattern are formed on a side of the gate insulating layer away from the gate pattern, where a surface of the first target pattern facing the gate insulating layer and a surface of the second target pattern facing the gate insulating layer are both the target surfaces.

Figure 11:
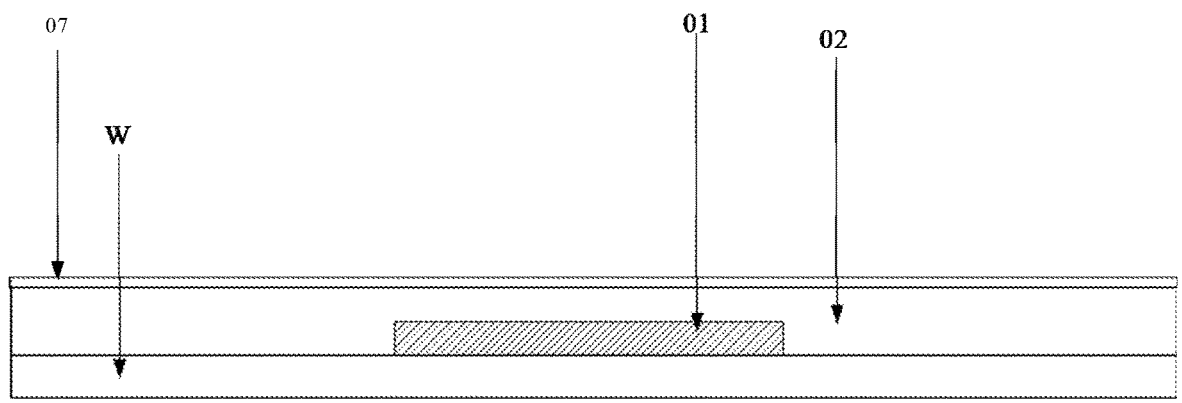
FIG. 11 is a schematic diagram of a local structure of a third thin film transistor provided in an embodiment of the present disclosure.
Figure 12:
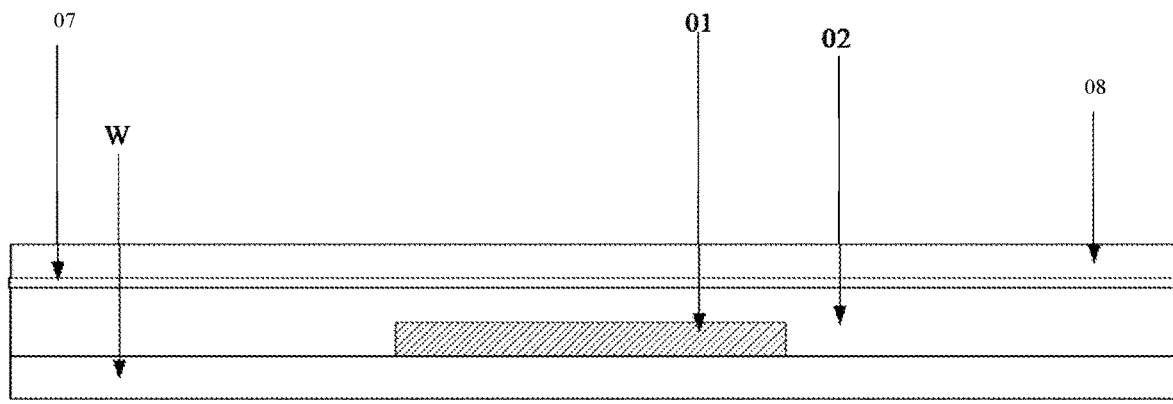
FIG. 12 is a schematic diagram of a local structure of a fourth thin film transistor provided in an embodiment of the present disclosure.

FIG. 11 is a schematic diagram of a local structure of a third thin film transistor provided in an embodiment of the present disclosure. As shown in FIG. 11, an oxide semiconductor material layer 07 may be first formed on a side of the gate insulating layer 02 away from the gate pattern 01. Then, as shown in FIG. 12, a photoresist layer 08 may be formed on a side of the oxide semiconductor material layer 07 away from the gate insulating layer 02.

Figure 13:
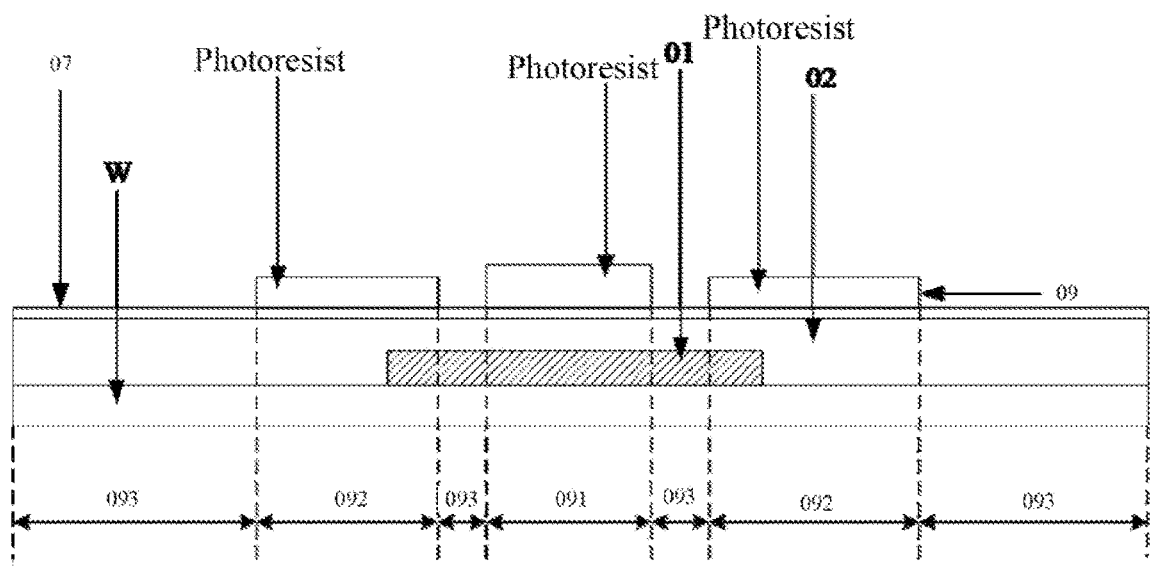
FIG. 13 is a schematic diagram of a local structure of a fifth thin film transistor provided in an embodiment of the present disclosure.

Afterwards, as shown in FIG. 13, an exposure treatment and a development treatment may be performed on the photoresist layer 08 using a grayscale mask plate (not shown in FIG. 13) to obtain a photoresist pattern 09. The photoresist pattern 09 may include a first photoresist region 091, two second photoresist regions 092 and a photoresist fully-removed region 093, and a photoresist thickness of the first photoresist region 091 is greater than a photoresist thickness of the second photoresist region 092.

Figure 14:
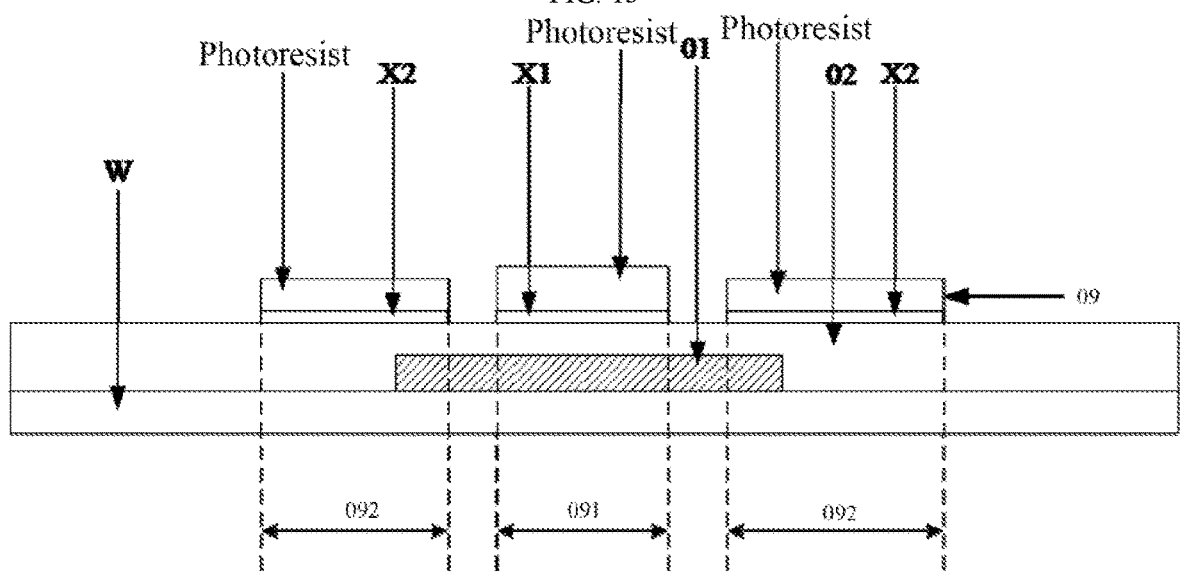
FIG. 14 is a schematic diagram of a local structure of a sixth thin film transistor provided in an embodiment of the present disclosure.

After the photoresist pattern 09 is obtained, as shown in FIG. 14, an etching treatment may be performed on the oxide semiconductor material layer 07 through the photoresist pattern 09 to remove an oxide semiconductor corresponding to the photoresist fully-removed region 093, so as to obtain a first oxide semiconductor region X1 corresponding to the first photoresist region 091, and two second oxide semiconductor regions X2 corresponding to the two photoresist regions 092.

Figure 15:
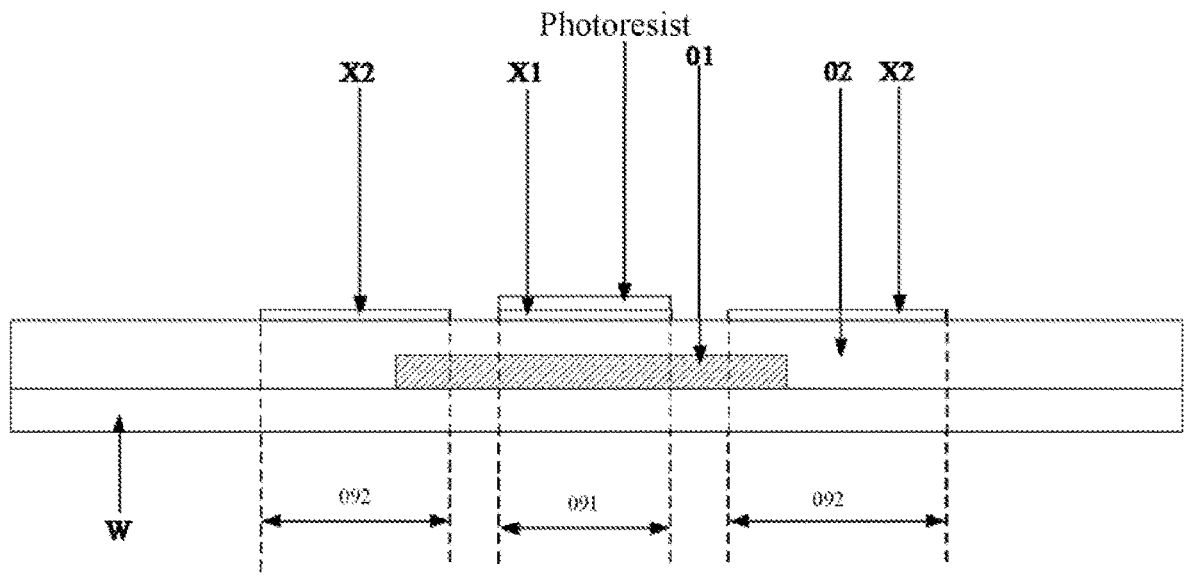
FIG. 15 is a schematic diagram of a local structure of a seventh thin film transistor provided in an embodiment of the present disclosure.

Then, as shown in FIG. 15, a graying treatment may be performed on the photoresist pattern, so as to remove photoresist on the two second photoresist regions 092 and thin the photoresist on the first photoresist region 091.

Figure 16:
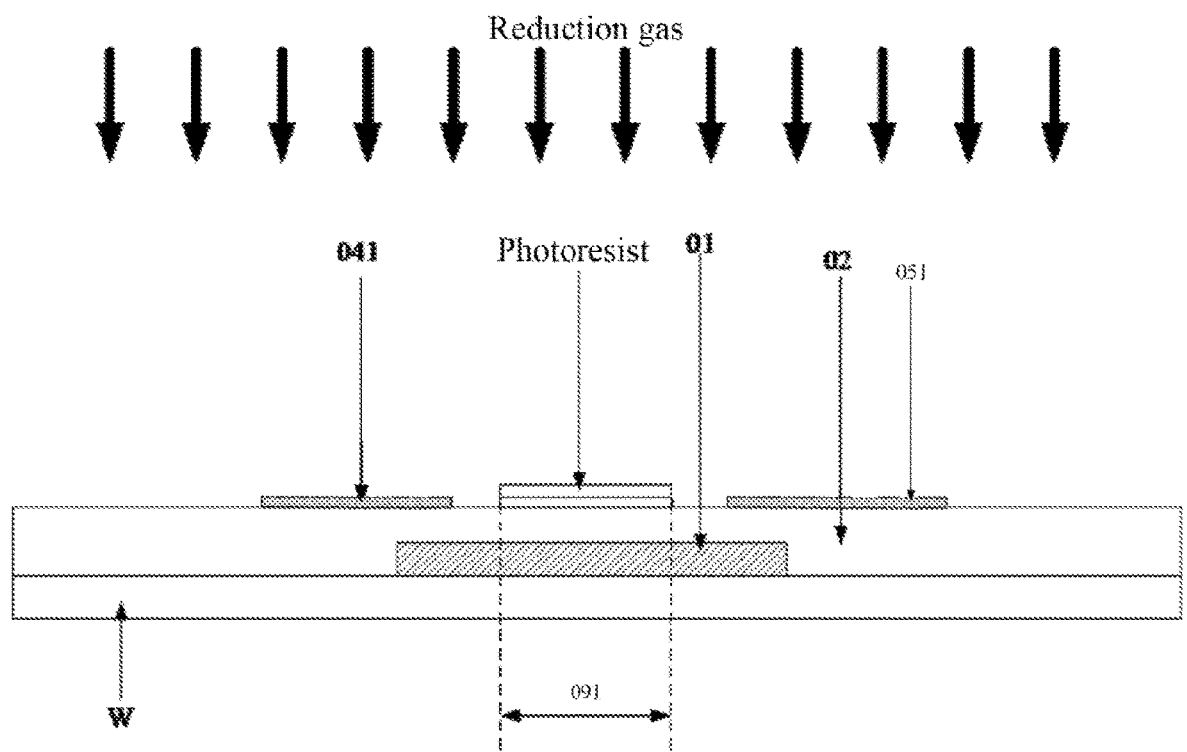
FIG. 16 is a schematic diagram of a local structure of a eighth thin film transistor provided in an embodiment of the present disclosure.

As shown in FIG. 16, after the thickness of the photoresist on the first photoresist region 091 is thinned, a reduction treatment may be performed on the oxide semiconductors of the two second oxide semiconductor regions X2 (for example, reduction gas, such as hydrogen and oxygen, may be input into the oxide semiconductor in the second semiconductor region), so as to obtain the first target pattern 041 and the second target pattern 051, where a material of the first target pattern 041 and a material of the second target pattern 051 are both reduced oxide semiconductors.

Figure 17:
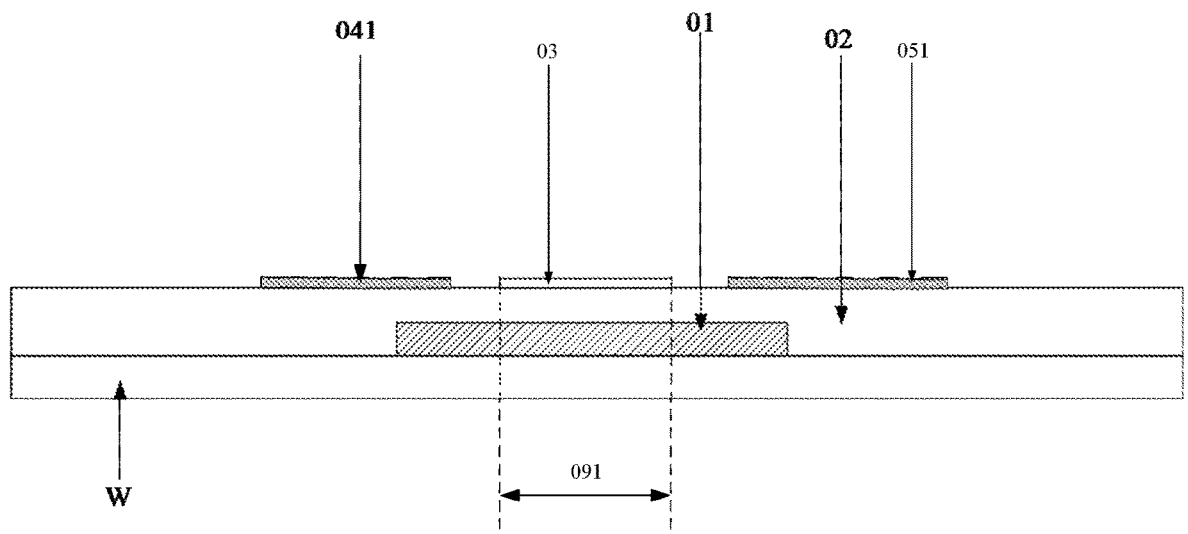
FIG. 17 is a schematic diagram of a local structure of a ninth thin film transistor provided in an embodiment of the present disclosure.

As shown in FIG. 17, after the first target pattern and the second target pattern are obtained, the photoresist on the first photoresist region 091 may be stripped to obtain the active layer pattern 03, where the active layer pattern 03 may include an oxide semiconductor of the first oxide semiconductor region 091.

In the step 804, a first electrode main pattern is formed on a side of the first target pattern away from the gate insulating layer, and a second electrode main pattern is formed on a side of the second target pattern away from the gate insulating layer.

Figure 18:
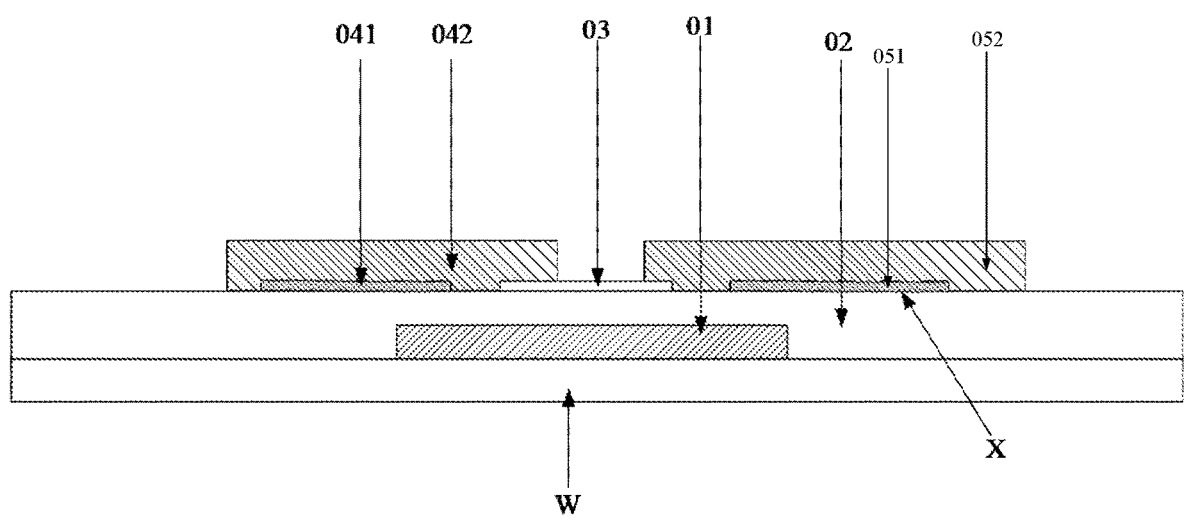
FIG. 18 is a schematic diagram of a local structure of a tenth thin film transistor provided in an embodiment of the present disclosure.

As shown in FIG. 18, after the first target pattern, the second target pattern and the active layer pattern are obtained, a first electrode main pattern 042 may be formed on a side of the first target pattern 041 away from the gate insulating layer 02, and a second electrode main pattern 052 is formed on a side of the second target pattern 051 away from the gate insulating layer 02.

Optionally, the surface of the first target pattern 041 facing the gate insulating layer 02 and the surface of the second target pattern 051 facing the gate insulating layer 02 are both the target surface X. That is, when lights enter the first target pattern 041 and the second target pattern 051, the lights can be diffusely reflected on the target surface of the first target pattern 041 and the target surface of the second target pattern 051, such that part of the lights cannot enter the gate pattern 01, and cannot be reflected by the gate pattern to the active layer pattern 03, thereby preventing the part of the lights from entering the active layer pattern 03.

As shown in FIG. 2, in order to prevent more light from entering the active layer pattern 03 as much as possible, the first target pattern 041 and the second target pattern 051 surround two ends of the active layer pattern 03, respectively. In addition, in order to ensure that the characteristics of the active layer pattern 03 are not affected by the first target pattern 041 and the second target pattern 051, both the first target pattern 041 and the second target pattern 051 may be set not to be connected with the active layer pattern 03.

Further, after the step 804, a passivation layer Y as shown in FIG. 1 may also be formed on a side of each of the first electrode main pattern 042 and the second electrode main pattern 052 away from the gate insulating layer 02.

In an embodiment of the present disclosure, a material of the first target pattern is a reduced oxide semiconductor, and a material of the active layer pattern is an oxide semiconductor. Therefore, the oxide semiconductor layer may be formed first, and then the first oxide semiconductor region and the second oxide semiconductor region may be simultaneously formed using the primary patterning process. The oxide semiconductor of the first oxide semiconductor region is also an active layer pattern. Later, a reduction treatment may be performed only on the oxide semiconductor of the second oxide semiconductor region, so as to obtain the first target pattern. That is, in the process of forming the first target pattern and the active layer pattern, only one primary patterning process is implemented, so the whole thin film transistor can be manufactured at a relatively high speed.

From the above, in the thin film transistor manufactured using the method provided in an embodiment of the present disclosure, since the surface of the source pattern facing the gate insulating layer, the surface of the drain pattern facing the gate insulating layer and the surface of the gate pattern facing the gate insulating layer include the target surface, and the target surface is capable of diffusely reflecting lights entering the target surface to prevent part of the lights from entering the active layer pattern, therefore, the amount of lights entering the active layer pattern is reduced, the deflection degree of a volt-ampere characteristic curve of the active layer pattern is decreased, and the influence of the light on the normal operation of the thin film transistor is weakened.

FIG. 19 is a method flowchart of yet another method for manufacturing a thin film transistor provided in an embodiment of the present disclosure. The thin film transistor may be the thin film transistor shown in FIG. 4, FIG. 5 or FIG. 6. As shown in FIG. 19, the method for manufacturing the thin film transistor may includes the following step.

In the step 1901, a thin film transistor including a gate pattern, a gate insulating layer, an active layer pattern, a source-drain pattern and a light absorption pattern is manufactured, where the gate pattern, the gate insulating layer, the active layer pattern and the source-drain pattern are sequentially stacked. The light absorption pattern is provided on at least a side of the gate insulating layer and is capable of absorbing lights entering the light absorption pattern, so as to prevent the lights from entering the active layer pattern. An orthographic projection region of the light absorption pattern on the gate insulating layer is a target region, an orthographic projection region of the source-drain pattern on the gate insulating layer and an orthographic projection region of the active layer pattern on the gate insulating layer form a reference region, and there is an overlapping region between the target region and the reference region.

Optionally, when the thin film transistor manufactured by using the method for manufacturing the thin film transistor provided by an embodiment of the present disclosure is as shown in FIG. 4, the light absorption pattern 06 is provided on a side of the gate insulating layer 02 close to the gate pattern 01 and covers the gate pattern 01. In this case, the method for manufacturing the thin film transistor may includes: forming a gate pattern on a base substrate; forming a light absorption layer on the base substrate on which the gate pattern is formed; forming a gate insulating layer on the base substrate on which the light absorption layer is formed; forming an active layer pattern on the base substrate on which the gate insulating layer is formed; and forming a source-drain electrode on the base substrate on which the active layer pattern is formed.

Optionally, when the thin film transistor manufactured by using the method for manufacturing the thin film transistor provided in an embodiment of the present disclosure is as shown in FIG. 5, the light absorption pattern 06 may also be provided on a side of the gate insulating layer 02 away from the gate pattern 01 and located between the gate insulating layer 02 and the active layer pattern 03. The target region A overlaps with the orthogonal projection region of the active layer pattern 03 on the gate insulating layer 02. In this case, the method for manufacturing the thin film transistor may include: forming a gate pattern on a base substrate; forming a gate insulating layer on the base substrate on which the gate pattern is formed; forming a light absorption pattern on the base substrate on which the gate insulating layer is formed, forming an active layer pattern on the base substrate on which the light absorption pattern is formed; and forming a source-drain pattern (including a source pattern and a drain pattern) on which the active layer pattern is formed.

Optionally, when the thin film transistor manufactured by using the method for manufacturing the thin film transistor provided in an embodiment of the present disclosure is as shown in FIG. 6, the light absorption pattern 06 may also be provided on a side of the gate insulating layer 02 away from the gate pattern 01 and located between the gate insulating layer 02 and the source-drain pattern. The target region A does not overlap with the orthogonal projection region of the active layer pattern 03 on the gate insulating layer 02 and has an overlapping region with the orthogonal projection region of the source-drain pattern on the gate insulating layer 2. The method for manufacturing the thin film transistor may include: forming a gate pattern on a base substrate; forming a gate insulating layer on the base substrate on which the gate pattern is formed; forming a light absorption pattern on the base substrate on which the gate insulating layer is formed, forming an active layer pattern on the base substrate on which the light absorption pattern is formed; and forming the source-drain pattern on which the active layer pattern is formed.

It should be noted that, regardless of whether the manufactured thin film transistor is as shown in FIG. 4, FIG. 5 or FIG. 6, it is necessary to ensure that there is an overlapping region between the target area and the reference area, so as to ensure that the light absorption pattern can absorb the lights being about to enter the active layer pattern.

From the above, since the thin film transistor manufactured by using the method provided in an embodiment of the present disclosure includes a light absorption pattern, the orthogonal projection region of the light absorption pattern on the gate insulating layer is the target region, the orthographic projection region of the source-drain pattern on the gate insulating layer and the orthographic projection region of the active layer pattern on the gate insulating layer form the reference region, and there is an overlapping region between the target region and the reference region, therefore, the lights entering a space between the active layer and the gate pattern can be absorbed by the light absorption pattern, the amount of lights entering the active layer pattern is reduced, the deflection degree of a volt-ampere characteristic curve of the active layer pattern is decreased, and the influence of the light on the normal operation of the thin film transistor is weakened.

As shown in FIG. 20, there is provided an array substrate in an embodiment of the present disclosure. The array substrate may include a base substrate W, and a plurality of thin film transistors 0 arrayed on the base substrate W. Each of the plurality of thin film transistors may be the thin film transistor as shown in any one of FIGS. 1 to 6.

There is provided a display panel in an embodiment of the present disclosure. The display panel may include the array substrate shown in FIG. 20. The display panel may be a liquid crystal display panel or an organic light emitting diode display panel, which is not limited in the embodiment of the present disclosure.

There is provided a display device in an embodiment of the present disclosure. The display device may include the array substrate as shown in FIG. 20. Exemplarily, the display device may be any product or component with a display function, such as electronic paper, a mobile phone, a tablet computer, a television, a display, a notebook computer, a digital photo frame or a navigator.

It should be noted that embodiments of the thin film transistor, embodiments of the method for manufacturing the thin film transistor, embodiments of the array substrate, embodiments of the display panel, and embodiments of the display device which are provided in the present disclosure may all refer to each other, which is not limited in the embodiments of the present disclosure.

It should be noted that in the accompanying drawings, the sizes of layers and regions may be exaggerated for clarity of illustration. It will also be understood that when an element or layer is described as being "on" another element or layer, it may be directly provided on the other element or there may be an intermediate layer therebetween. In addition, it will be understood that when an element or layer is described as being "under" another element or layer, it can be directly provided under the other elements or layers, or there may be one or more intermediate layers or elements therebetween. Moreover, it will also be understood that when a layer or element is described as being "between" two layers or two elements, there may be an only layer between two layers or two elements, or there may also be one or more intermediate layers or elements therebetween. Similar reference numerals throughout the whole paper refer to similar elements.

The foregoing descriptions are merely some embodiments of the present disclosure, and are not intended to limit the present disclosure. Within the spirits and principles of the disclosure, any modification, equivalent substitution, improvement, and etc. are within the protection scope of the present disclosure.

What is claimed is:

1. A thin film transistor, comprising a gate pattern, a gate insulating layer, an active layer pattern, a source pattern and a drain pattern that are sequentially stacked, a material of the active layer pattern is a metal oxide semiconductor, the source pattern and the drain pattern are spaced apart and are both connected to the active layer pattern, orthographic projections of the gate pattern, the active layer pattern and the source pattern onto the gate insulating layer have an overlapping area, orthographic projections of the gate pattern, the active layer pattern and the drain pattern onto the gate insulating layer have an overlapping area; wherein the gate pattern comprises a first area and a second area, an orthographic projections of the first area onto the gate insulating layer and the orthographic projection of the active layer pattern onto the gate insulating layer coincide, and the first area is enclosed by the second area;

the source pattern comprises a first conductive metal oxide structure disposed in a surface of the source pattern facing the gate insulating layer, and the first conductive metal oxide structure and the active layer pattern are both disposed on the gate insulating layer and are spaced apart from each other, the drain pattern comprises a second conductive metal oxide structure disposed in a surface of the drain pattern facing the gate insulating layer, and the second conductive metal oxide structure and the active layer pattern are both disposed on the gate insulating layer and are spaced apart from each other;

the active layer pattern is rectangular, the first conductive metal oxide structure and the second conductive metal oxide structure are both U-shaped, and are respectively located on opposite sides of the active layer pattern, each surrounding the active layer pattern;

a surface of the first conductive metal oxide structure facing the gate insulating layer and a surface of the second conductive metal oxide structure facing the gate insulating layer are both rough surfaces, the rough surface surfaces are capable of diffusely reflecting light arriving at the rough surfaces, so as to reduce light entering the active layer pattern.

2. The thin film transistor according to claim 1, wherein the gate pattern comprises a third electrode main pattern, and a third target pattern provided on a side of the third electrode main pattern, the gate insulating layer is provided on a side of the third target pattern away from the third electrode main pattern, and a surface of the third target pattern away from the third electrode main pattern is a rough surface.

3. The thin film transistor according to claim 1, wherein the gate pattern comprises a third electrode main pattern, and a third target pattern provided on a side of the third electrode main pattern, the gate insulating layer is provided on a side of the third target pattern away from the third electrode main pattern, and a surface of the third target pattern away from the third electrode main pattern is a rough surface.

4. The thin film transistor according to claim 1, further comprising a passivation layer, wherein a pixel electrode is connected with the drain pattern through a via hole in the passivation layer.

5. The thin film transistor according to claim 1, the metal oxide semiconductor is indium gallium zinc oxide.

6. The thin film transistor according to claim 1, wherein the source pattern further comprises a first electrode main pattern, disposed on a side of the first conductive metal oxide away from the gate pattern;

the drain pattern further comprises a second electrode main pattern, disposed on a side of the second conductive metal oxide away from the gate pattern; and the first electrode main pattern and the second electrode main pattern are both connected to the active layer pattern.

7. An array substrate, comprising a thin film transistor, wherein the thin film transistor comprises a gate pattern, a gate insulating layer, an active layer pattern, a source pattern and a drain pattern that are sequentially stacked, a material of the active layer pattern is a metal oxide semiconductor, the source pattern and the drain pattern are spaced apart and are both connected to the active layer pattern, orthographic projections of the gate pattern, the active layer pattern and the source pattern onto the gate insulating layer have an overlapping area, orthographic projections of the gate pattern, the active layer pattern and the drain pattern onto the gate insulating layer have an overlapping area; wherein the gate pattern comprises a first area and a second area, an orthographic projections of the first area onto the gate insulating layer and the orthographic projection of the active layer pattern onto the gate insulating layer coincide, and the first area is enclosed by the second area;

the source pattern comprises a first conductive metal oxide structure disposed in a surface of the source pattern facing the gate insulating layer, and the first conductive metal oxide structure and the active layer pattern are both disposed on the gate insulating layer and are spaced apart from each other;

the drain pattern comprises a second conductive metal oxide structure disposed in a surface of the drain pattern facing the gate insulating layer, and the second conductive metal oxide structure and the active layer pattern are both disposed on the gate insulating layer and are spaced apart from each other;

the active layer pattern is rectangular, the first conductive metal oxide structure and the second conductive metal oxide structure are both U-shaped, and are respectively located on opposite sides of the active layer pattern, each surrounding the active layer pattern;

a surface of the first conductive metal oxide structure facing the gate insulating layer and a surface of the second conductive metal oxide structure facing the gate insulating layer are both rough surfaces, the rough surface are capable of diffusely reflecting light arriving at the rough surfaces, so as to reduce light entering the active layer pattern.

8. A display panel, comprising the array substrate according to claim 7, wherein the display panel is a liquid crystal display panel or an organic light emitting diode display panel.

9. The array substrate according to claim 7, wherein the gate pattern comprises a third electrode main pattern, and a third target pattern provided on a side of the third electrode main pattern, the gate insulating layer is provided on a side of the third target pattern away from the third electrode main pattern, and a surface of the third target pattern away from the third electrode main pattern is a rough surface.

10. The array substrate according to claim 7, wherein the gate pattern comprises a third electrode main pattern, and a third target pattern provided on a side of the third electrode main pattern, the gate insulating layer is provided on a side of the third target pattern away from the third electrode main pattern, and a surface of the third target pattern away from the third electrode main pattern is a rough surface.

11. The array substrate according to claim 7, wherein the thin film transistor further comprises a passivation layer, and a pixel electrode is connected with the drain pattern through a via hole in the passivation layer.

12. The array substrate according to claim 7, wherein the source pattern further comprises a first electrode main pattern, disposed on a side of the first conductive metal oxide away from the gate pattern;

the drain pattern further comprises a second electrode main pattern, disposed on a side of the second conductive metal oxide away from the gate pattern; and the first electrode main pattern and the second electrode main pattern are both connected to the active layer pattern.

13. A method for manufacturing a thin film transistor, comprising:

forming a gate pattern, the gate pattern comprises a first area and a second area, and the first area is enclosed by the second area;

forming a gate insulating layer on a side of the gate pattern;

forming an active layer pattern made of metal oxide semiconductor material, a source pattern and a drain pattern that are sequentially stacked on a side of the gate insulating layer away from the gate pattern, wherein the active layer pattern is made of metal oxide semiconductor material, the active layer pattern is rectangular and an orthographic projection of the active layer pattern onto the gate insulating layer and an orthographic projections of the first area onto the gate insulating layer coincide, the source pattern and the drain pattern are spaced apart and are both connected to the active layer pattern, orthographic projections of the gate pattern, the active layer pattern and the source pattern onto the gate insulating layer have an overlapping area, orthographic projections of the gate pattern, the active layer pattern and the drain pattern onto the gate insulating layer have an overlapping area; wherein the source pattern comprises a first conductive metal oxide structure disposed in a surface of the source pattern facing the gate insulating layer, and the first conductive metal oxide structure and the active layer pattern are both disposed on the gate insulating layer and are spaced apart from each other;

the drain pattern comprises a second conductive metal oxide structure disposed in a surface of the drain pattern facing the gate insulating layer, and the second conductive metal oxide structure and the active layer pattern are both disposed on the gate insulating layer and are spaced apart from each other;

the first conductive metal oxide structure and the second conductive metal oxide structure are both U-shaped, and are respectively located on opposite sides of the active layer pattern, each surrounding the active layer pattern;

a surface of the first conductive metal oxide facing the gate insulating layer and a surface of the second conductive metal oxide structure facing the gate insulating layer are both rough surfaces, the rough surface are capable of diffusely reflecting light arriving at the rough surfaces, so as to reduce light entering the active layer pattern.

14. The method according to claim 13, wherein forming the active layer pattern, the source pattern and the drain pattern on the side of the gate insulating layer away from the gate pattern includes:

forming an oxide semiconductor material layer on a side of the gate insulating layer away from the gate pattern;

forming a photoresist layer on a side of the oxide semiconductor material layer away from the gate pattern;

performing an exposure treatment and a development treatment on the photoresist layer using a grayscale mask plate to obtain a photoresist pattern, wherein the photoresist pattern comprises a first photoresist region, two second photoresist regions and a photoresist fully-removed region, and a photoresist thickness of the first photoresist region is greater than a photoresist thickness of the second photoresist region;

performing an etching treatment on the oxide semiconductor material layer through the photoresist pattern to remove an oxide semiconductor corresponding to the photoresist fully-removed region to obtain a first oxide semiconductor region corresponding to the first photoresist region, and two second oxide semiconductor regions corresponding to the two photoresist regions;

performing a graying treatment on the photoresist pattern to remove photoresist on the two second photoresist regions and thin the photoresist on the first photoresist region;

performing a reduction treatment on the oxide semiconductor of the two second oxide semiconductor regions to obtain the first conductive metal oxide structure and the second conductive metal oxide structure; and stripping the photoresist on the first photoresist region to obtain the active layer pattern, wherein the active layer pattern comprises an oxide semiconductor of the first oxide semiconductor region.

15. The method according to claim 13, wherein the source pattern further comprises a first electrode main pattern, and the drain pattern further comprises a second electrode main pattern;

forming the active layer pattern, the source pattern and the drain pattern on the side of the gate insulating layer away from the gate pattern comprises:

forming the active layer pattern, the first conductive metal oxide and the second conductive metal oxide on the side of the gate insulating layer away from the gate pattern;

forming the first electrode main pattern on a side of the first conductive metal oxide away from the gate pattern, and forming the second electrode main pattern on a side of the second conductive metal oxide away from the gate pattern, wherein the first electrode main pattern and the second electrode main pattern are both connected to the active layer pattern.

16. The method according to claim 13, wherein the method further includes:

forming a third electrode main pattern;

forming a third target pattern on a side of the third electrode main pattern, wherein a surface in the third target pattern away from the third electrode main pattern is a rough surface, and the gate pattern comprises the third electrode main pattern and the third target pattern;

forming the gate insulating layer on a side of the third target pattern away from the third electrode main pattern;

forming the active layer pattern on a side of the gate insulating layer away from the third electrode main pattern; and forming the source pattern and the drain pattern on a side of the active layer pattern away from the gate pattern.

* * * * *